(12) United States Patent
Jun et al.

(10) Patent No.: US 8,185,797 B2
(45) Date of Patent: May 22, 2012

(54) BASIC MATRIX, CODER/ENCODER AND GENERATION METHOD OF THE LOW DENSITY PARITY CHECK CODES

(75) Inventors: Xu Jun, Shenzen (CN); Yougang Zhang, Shenzen (CN); Liuqing Yuan, Shenzen (CN)

(73) Assignee: ZTE Corporation (CN)

( * ) Notice: Subject to any disclaimer, the term of this patent is extended or adjusted under 35 U.S.C. 154(b) by 1115 days.

(21) Appl. No.: 11/718,701

(22) PCT Filed: Apr. 25, 2005

(86) PCT No.: PCT/CN2005/000571
§ 371 (c)(1),
(2), (4) Date: May 4, 2007

(87) PCT Pub. No.: WO2006/047919
PCT Pub. Date: May 11, 2006

(65) Prior Publication Data
US 2009/0106625 A1    Apr. 23, 2009

(30) Foreign Application Priority Data
Nov. 4, 2004 (CN) .......................... 2004 1 0009746

(51) Int. Cl.
*H03M 13/00* (2006.01)
(52) U.S. Cl. .......................................... 714/758; 714/774
(58) Field of Classification Search .................. 714/758, 714/774
See application file for complete search history.

(56) References Cited

U.S. PATENT DOCUMENTS

| | | | |
|---|---|---|---|
| 6,633,856 B2 * | 10/2003 | Richardson et al. | 706/15 |
| 6,895,547 B2 * | 5/2005 | Eleftheriou et al. | 714/801 |
| 7,260,763 B2 * | 8/2007 | Sukhobok et al. | 714/758 |
| 2003/0014718 A1 * | 1/2003 | De Souza et al. | 714/804 |
| 2004/0034828 A1 * | 2/2004 | Hocevar | 714/800 |
| 2004/0153959 A1 | 8/2004 | Kim et al. | |
| 2004/0186992 A1 | 9/2004 | Matsumoto | |

FOREIGN PATENT DOCUMENTS

| | | |
|---|---|---|
| WO | 02099976 A | 12/2002 |
| WO | 03056705 A | 7/2003 |

* cited by examiner

*Primary Examiner* — M. Mujtaba K Chaudry
(74) *Attorney, Agent, or Firm* — Sutherland Asbill & Brennan LLP

(57) ABSTRACT

The invention relates to a base matrix, a encoder/decoder of Low Density Parity Check (LDPC) codes and a generation method thereof. The encoder/decoder is determined uniquely by the parity check matrix of the LDPC codes. With different code sizes, said parity check matrix can be obtained by expanding different base matrixes, and also can be obtained by expanding a unique base matrix after correction. Elements of said base matrix must meet an inequation in which the girth value is up to the standard, e.g. when girth≧6, for any element i, j, k, l in the matrix which forms the short loop having a length of 4 in anticlockwise, there are always mod(i−j+k−l, z) unequal to 0. By this invention, the girth of the constructed base matrix is made as large as possible, the amount of the shortest loops is as few as possible when it is the same girth, thus the curve of bit error ratio (BER) is dropped quickly, the error floor of the LDPC codes is eliminated effectively, and the optimal performance of the LDPC codes is obtained.

15 Claims, 6 Drawing Sheets

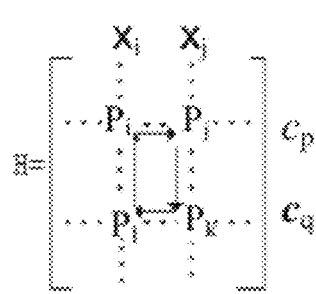 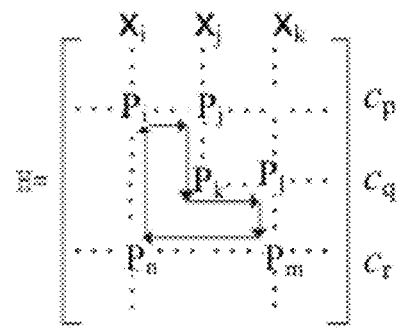
Fig 6  Fig 7
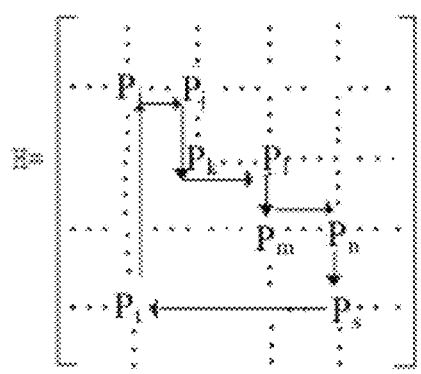
Fig 8
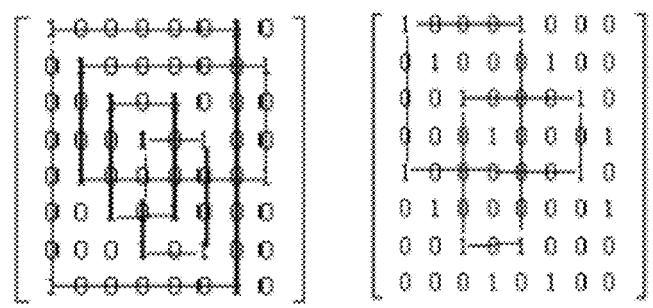
Fig 9

US 8,185,797 B2

BASIC MATRIX, CODER/ENCODER AND GENERATION METHOD OF THE LOW DENSITY PARITY CHECK CODES

RELATED APPLICATIONS

This is a submission pursuant to 35 U.S.C. 154(d)(4) to enter the national stage under 35 U.S.C. 371 for PCT/CN2005/000571, filed Apr. 25, 2005. Priority is claimed under 35 U.S.C. 119(a) and 35 U.S.C. 365(b) to Chinese Patent Application No. CN200410009746.5, filed Nov. 4, 2004.

TECHNICAL FIELD

The invention relates to an encoder/decoder for correcting data transmission errors in digital communication system, especially relates to a base matrix, an encoder/decoder of Low Density Parity Check (LDPC) code and a generation method thereof based on identity matrix and cyclic shift matrices for error correcting technique in digital communication field, and it is especially applicable for the case of particular code rate and variable code size.

BACKGROUND ART

All the digital communication systems, such as communication, radar, remote control and test, storage system and inner operation of digital computer, and data transmission between computers, can be concluded as the model shown in FIG. 1.

The source encoder in FIG. 1 is used for promoting transmission validity. The channel encoder is employed for resisting various noise and interference during the transmission, allowing the system to have the ability of correcting errors automatically by adding redundancy information artificially, thereby ensuring the reliability of data transmission. With development of wireless digital communication and emergence of various services with high speed and strong burst, there are increasingly higher demands for the error-correcting coding techniques.

At the beginning, researches on the error-correcting code was mainly focused on linear block code based on algebra theory, later, a series of good codes such as Hamming code, cyclic code, BCH code and RS code came forth. The convolution code appearing in 1950s introduced the register during coding, increasing the relativity between the code cells, and thus obtaining higher coding gain than the block code under same complexity conditions. With the appearance of various convolution code decoding algorithms (Viterbi algorithm), the convolution code has been researched deeply and applied widely. In 1993, Frenchmen C. Berrou et al invented Turbo code, which pushed forward a large step toward the extreme of the coding performance. Enlightened by the Turbo code which is a great success, another kind of coding with similar characters and performance draws people's attention, i.e. the Low Density Parity Check Codes (LDPC codes). LDPC code is a type of liner block code that can be defined by sparse parity check matrix or bi-partite graph. It was initially discovered by Gallager, and that's why it is called Gallager code. Being silent for several decades, with the development of computer hardware and associated theories, Mackay and Neal rediscovered it and proved that it has performance approaching Shannon limit. The latest researches show that the LDPC code has the following advantages: low decoding complexity, being able of linear time coding, having performance approaching Shannon limit, being capable of parallel decoding, and superior to Turbo code in the scenario of large code size.

LDPC code is a type of linear block code based on sparse check matrix. The encoding and decoding of low complexity are realized rightly by utilizing the sparsity of the check matrix of the LDPC code, thereby making the LDPC code practicable. The Gallager code mentioned above is a type of regular LDPC code (regular ldpcc), while Luby and Mitzenmacher etc. spreaded the Gallager code and advanced the irregular LDPC code (irregular ldpcc). The code that Gallager invented originally has regular code structure; its check matrix is sparse matrix with each row having the same number of 1s, and each column also having the same number of 1s. M. G. Luby believes that if the number of non-zero elements in the rows or columns of the check matrix is allowed to vary, and at the same time the sparsity of the matrix is ensured, then the decoding algorithm of the coding is still applicable, while the performance of the coding can be improved greatly so that it can reach, or even exceed the performance of the Turbo code. The reasons are in this type of coding structure, if the left node and the right node corresponding to the bipartite graph have appropriate degree distribution, there would be a waveform effect when decoding, which will promote the performance of decoding greatly. The irregular code is rightly this type of low density coding that permits different degrees for the same kind of nodes, while the code that Gallager advanced originally is called regular code correspondingly.

For the LDPC codes of medium and short sizes, short cycles in the bi-partite graph will decrease the code performance greatly, which makes the research on how to construct non-short-cycles become ever important. Currently, the relevant construction methods mainly include combination construction, limited geometrical construction, group theory construction and graph theory construction etc, which, however, are mainly oriented to the regular codes, and have many limitations with too strong theorization and low practicability, J. Campello etc. put forward the extended Bit-Filling algorithm, by which, LDPC codes with high code rate and definite girth ("girth" means the length of the shortest cycle of the bi-partite graph of LDPC codes) or LDPC codes with definite code rate and large girth can be designed. It is a general method, with proper amendments, it can be used to design the irregular LDPC codes with ensured girth. Therefore, how to find the LDPC codes having as few of short cycles as possible becomes very important.

Currently, the method of constructing the LDPC codes with freely changeable code sizes through identity matrix and cyclic shift matrices thereof is raised in many documents. Such LDPC code with block cyclic parity check matrices becomes a hot research subject presently. However, the code construction method for such LDPC code having as few of the short cycles as possible is now not very comprehensive yet.

The LDPC code based on the identity matrix and the cyclic shift matrices thereof becomes a key research subject in the academe currently, since it has freely changeable code sizes, its coding is simply to realize, and the degree distribution and girth distribution can remain unchanged during the extension. The LDPC code based on the identity matrix and the cyclic shift matrices thereof constructed currently does not take the effect of the girth and the relationship between the code size and the girth into full consideration, causing that the bit error rate (BER) curve decreases under a relatively high signal noise rate (SNR) at a dramatically slowed down speed, the error floor often appears, and thereby degrading the performance. It becomes a problem demanding prompt solution that how to eliminate the error floor of the LDPC code, accelerate the decreasing speed of the BER curve, and improve the performance of the LDPC code under the case of high SNR.

SUMMARY OF THE INVENTION

The technical problem to be solved by the invention is to provide a base matrix of Low Density Parity Check (LDPC) codes and a construction method thereof, so as to make the girth of the constructed base matrix as large as possible, and the number of the shortest cycle with the same girth as few as possible, thereby enable the uniquely determined encoder and decoder to eliminate the error floor of the LDPC codes effectively, accelerate the decreasing speed of the BER curve, and improve the performance of the LDPC codes.

For the purpose above, the invention provides a method for constructing the base matrix of LDPC codes, including the following steps:

Step 1, determining the code rate, code size and the number of parity bits of the base matrix of LDPC codes to be constructed;

Step 2, determining a row weight vector and a column weight vector of said base matrix;

Step 3, constructing an original base matrix based on said row weight vector and column weight vector, wherein the girth is as large as possible and the number of the shortest cycles with the same girth is as few as possible, wherein the girth is the length of the shortest cycle;

Step 4, selecting values from set $\{0, 1, 2, \ldots, z-1\}$ for placing on all the "1" positions in the matrix one by one based on the said original base matrix constructed, and constructing the base matrix with a girth as large as possible, wherein, z is extension factor.

Further, the above construction method may also have the following feature: said step 3 adopts Bit-Filling algorithm to construct the original base matrix whose girth is as large as possible and the number of the shortest cycles is as few as possible;

Further, the above construction method may also have the following feature: in said step 4 of constructing the base matrix, the part corresponding to check bits adopts quasi-lower triangular structure;

Further, the above construction method may also have the following feature: said step 4 can be divided into the following steps of;

(a) with the part of the constructed base matrix being the object, searching all possible paths by starting from the edge in the bi-partite graph that corresponds to an element which will be filled, in order to find all the short cycles;

(b) when choosing a value for the element, preferably choosing the value meeting the requirement of the base matrix girth$\geq 10$, if such a value can not be found, choosing the value meeting the requirement of the base matrix girth$\geq 8$, if still can not be found, choosing the value meeting the requirement of the base matrix girth$\geq 6$;

In the scenario of the base matrix girth$\geq 10$, the values of the element and other elements which jointly construct said short cycles should satisfy: for arbitrary elements i, j, k, l, which construct in anticlockwise a short cycle with a length of 4 among said short cycles, there is always mod(i−j+k−l, z/2) ≠10; for arbitrary elements i, j, k, l, m, n, which construct in anticlockwise a short cycle with a length of 6 among said short cycles, there is always mod(i−j+k−l+m−n, z)≠0; and for arbitrary elements i, j, k, l, m, n, s, t, which construct in anticlockwise a short cycle with a length of 8 among said short cycles, there is always mod(i−j+k−l+m−n+s−t, z)≠0;

In the scenario of the base matrix girth$\geq 8$, the values of the element and other elements which jointly construct said short cycles should satisfy: for arbitrary elements i, j, k, l, which construct in anticlockwise the short cycle with a length of 4 among said short cycles, there is always mod(i−j+k−l, z)≠0; for arbitrary elements i, j, k, l, m, n, which construct in anticlockwise the short cycle with a length of 6 among said short cycles, there is always mod(i−j+k−l+m−n, z)≠0;

In the scenario of the base matrix girth$\geq 6$, the values of the element and other elements which jointly construct said short cycles should satisfy: for arbitrary elements i, j, k, l, which construct in anticlockwise the short cycle with a length of 4 among said short cycles, there is always mod(i−j+k−l, z)≠0;

(c) repeating the above steps (a) and (b) till finishing the choosing of values for all the non-zero elements, and thereby obtaining the base matrix with the girth as large as possible.

Further, the above construction method may also have the following features: said parity check matrix under different code sizes is obtained by extending a unique base matrix; in said step (b) of choosing values from the set $\{0, 1, 2, \ldots, z_{max}-1\}$, $z_{max}$ indicates the extension factor of the LDPC code with the largest code size; and there is also a step (b1) between steps (b) and (c): after the appropriate value is chosen, correcting the base matrix to be the one that corresponds to all other code sizes, for the values of this element and the other elements which construct said short cycle together with it in every base matrix attained after correction, it is to decide whether they satisfy the girth demand for the base matrix, if they satisfy, it is to choose the next position, otherwise, it is to return to step (b) to choose the value again.

Further, the construction method above still possesses the following characteristic: said correction for the base matrix calculates using the method of mod, floor or round based on the number of the columns in the base matrix and the code size of the Low Density Parity Check code to generate parity check matrix.

Further, the construction method above still possesses the following characteristic: the demand for the girth of said base matrix is: the girth$\geq 8$, or the girth$\geq 6$.

In order to solve the technical problem above, this invention also provides a base matrix of LDPC codes with particular code rate and particular code size, characterized in that the elements of the base matrix has to satisfy at least one of the following conditions:

Condition 1, for arbitrary elements i, j, k, l, which construct in anticlockwise the short cycle with a length of 4, there is always mod(i−j+k−l, z)≠0;

Condition 2, for arbitrary elements i, j, k, l, which construct in anticlockwise the short cycle with a length of 4, there is always mod(i−j+k−l, z)≠0; and for arbitrary elements i, j, k, l, m, n, which construct in anticlockwise the short cycle with a length of 6, there is always mod(i−j+k−l+m−n, z)≠0;

Condition 3, for arbitrary elements i, j, k, l, which construct in anticlockwise the short cycle with a length of 4, there is always mod(i−j+k−l, z/2)≠0; for arbitrary elements i, j, k, l, m, n, which construct in anticlockwise the short cycle with a length of 6, there is always mod(i−j+k−l+m−n, z)≠0; and for arbitrary elements i, j, k, l, m, n, s, t, which construct in anticlockwise the short cycle with a length of 8, there is always mod(i−j+k−l+m−n+s−t, z)≠0;

Wherein, z indicates the extension factor of the LDPC codes with particular code rate and particular code size.

In order to solve the technical problem above, this invention also provides a plurality of base matrices of LDPC codes with particular code rate and multiple code sizes, characterized in that the elements of the base matrices have to satisfy at least one of the following conditions:

When $\forall z \in [z_{min}, L, z_{max}]$ (i.e. z refers to an arbitrary value in the set), for arbitrary elements I, j, k, l in each base matrix corresponding to z, which construct in anticlockwise (same effects can be achieved when in clockwise) the short cycle with a length of 4, there is always mod(i−j+k−l, z)≠0;

When $\forall z \in [z_{min}, L, z_{max}]$, for arbitrary elements i, j, k, l in each base matrix corresponding to z, which construct in anticlockwise the short cycle with a length of 4, there is always mod(i−j+k−l, z/)≠0; and for arbitrary elements i, j, k, l, m, n, which construct in anticlockwise the short cycle with a length of 6, there is always mod(i−j+k−l+m−n, z)≠0;

When $\forall z \in [z_{min}, L, z_{max}]$, for arbitrary elements i, j, k, l in each base matrix corresponding to z, which construct in anticlockwise the short cycle with a length of 4, there is always mod(i−j+k−l, z/2)≠0; for arbitrary elements i, j, k, l, m, n, which construct in anticlockwise the short cycle with a length of 6, there is always mod(i−j+k−l+m−n, z)≠0; and for arbitrary elements i, j, k, l, m, n, s, t which construct in anticlockwise the short cycle with a length of 8, there is always mod (i−j+k−l+m−n+s−t, z)≠0.

Wherein z refers to an arbitrary extension factor appearing in set $[z_{min}, z_{max}]$, each of which corresponds to a base matrix under a corresponding code size, $z_{min}$ refers to the extension factor of the LDPC code with the shortest code size, $z_{max}$ refers to the extension factor of the LDPC code with the longest code size; the position of "non minus 1" elements of the plurality of base matrices of the LDPC codes with particular code rate and multiple code sizes are always the same, whereas the values of the positions are different.

In order to solve the technical problem above, this invention also provides a unique base matrix of the LDPC codes with particular code rate and multiple code sizes, the elements of the unique base matrix need to be corrected when in the condition of different code sizes, characterized in that the elements of the unique base matrix have to satisfy at least one of the following conditions:

When $\forall z \in [z_{min}, L, z_{max}]$, after the elements are corrected according to the code size, for arbitrary elements I, j, k, l which construct in anticlockwise (same effects can achieved when in clockwise) the short cycle with a length of 4, there is always mod(i−j+k−l, z)≠0;

When $\forall z \in [z_{min}, L, z_{max}]$, after the elements are corrected according to the code size, for arbitrary elements i, j, k, l which construct in anticlockwise the short cycle with a length of 4, there is always mod(i−j+k−l, z)≠0, and for arbitrary elements i, j, k, l, m, n which construct in anticlockwise the short cycle with a length of 6, there is always mod(i−j+k−l+m−n+s−t, z)≠0;

When $\forall z \in [z_{min}, L, z_{max}]$, after the elements are corrected according to the code size, for arbitrary elements i, j, k, l which construct in anticlockwise the short cycle with a length of 4, there is always mod(i−j+k−l, z/2)≠0; for arbitrary elements i, j, k, l, m, n which construct in anticlockwise the short cycle with a length of 6, there is always mod(i−j+k−l+m−n, z)≠0; and for arbitrary elements i, j, k, l, m, n, s, t which construct in anticlockwise the short cycle with a length of 8, there is always mod(i−j+k−l+m−n+s−t, z)≠0.

Wherein, z refers to an arbitrary extension factor appearing in set $[z_{min}, L, \ldots z_{max}]$, $z_{min}$ is the extension factor of the LDPC code with the smallest code size, and $z_{max}$ is the extension factor of the LDPC code with the largest code size.

The technical problem to be solved by this invention is to provide an encoder and a decoder based on LDPC codes and a generation method thereof, so that the encoder and decoder are able to eliminate the error floor of LDPC codes effectively, accelerate the decreasing speed of the BER curve, and promote the performance of LDPC codes.

For the purpose above, this invention provides a method for generating an encoder/decoder based on LDPC codes, which is determined uniquely by a parity check matrix of LDPC codes, characterized in that said parity check matrix is constructed through the following steps of:

Step 1, determining the code rate, code size, and the number of parity bits of the base matrix of LDPC codes to be constructed;

Step 2, determining the row weight vector and column weight vector of said base matrix;

Step 3, based on said row weight vector and column weight vector, constructing the original base matrix with the girth as large as possible and the number of the shortest cycle as few as possible under the same girth, wherein the girth refers to the length of the shortest cycle;

Step 4, based on said original base matrix constructed, choosing values from set {0, 1, 2, L, z−1}, placing them one by one on all of "1" positions in the matrix, and constructing the base matrix with the girth as large as possible, in which "z" refers to the extension factor;

Step 5, extending said base matrix to get the required parity check matrix of the LDPC codes.

Further, the above method for constructing the base matrix can be applied to said steps 1 to 4 of the method for constructing the encoder and decoder.

Further, the above method may also possess the following features: said parity check matrix under different code sizes is obtained by extending the unique base matrix; in said step 4 of choosing the values, the base matrix under all of the code sizes or the base matrix obtained through correction is required to satisfy the demands of large girth; and in said step 5, the unique base matrix is corrected according to the actual code size, and then is extended according to the corresponding extension factor to be the required parity check matrix.

Further, the above method may also possess the following features: said parity check matrixes under different code sizes are generated from different base matrixes; in said step 5, the base matrix corresponding to the actual code size is extended according to its extension factor to be the required parity check matrix.

Further, the above method may also possess the following feature: in said step 5, the identity matrix and the cyclic shift matrix thereof are employed as the basic permutation matrix to extend the said base matrix to be the parity check matrix.

In order to solve the technical problem above, this invention also provides an encoder based on the LDPC codes, characterized in including a storage module and an encoding operation module, wherein:

said storage module is for storing the base matrix of the parity check matrix;

said encoding operation module is for accomplishing the encoding operation for getting codeword from source data.

Further, said encoder may possess the following features: said storage module stores the base matrixes corresponding to each of the code sizes, which may possess the features of the base matrixes disclosed above in this invention.

Further, the encoder above may possess the following features: it further includes an extension module for extending the base matrix corresponding to the current code size according to the extension factor and the basic permutation matrix so as to get the parity check matrix of the LDPC code, according to which, said encoding operation module completes the encoding operation.

Further, the encoder above may possess the following features: said storage module stores the unique base matrix corresponding to each code size, and the encoder also includes a correction module, which is for reading the base matrix from the storage module according to the code size of the current data stream, correcting the non-minus value in the matrix and handing over the same to the following modules for processing; the correction pattern adopted in the correction is the one used for constructing the base matrix; the unique base matrix may possess the features of the unique base matrix disclosed above in this invention.

In order to solve the technical problem above, this invention also provides a decoder based on the LDPC codes, characterized in including a storage module and a decoding operation module, wherein:

said storage module is for storing the base matrix of the parity check matrix;

said decoding operation module is for correcting the input codeword bits interfered, and then outputting the same.

Further, the decoder above may possess the following features: said storage module stores the base matrix corresponding to each code size, which may possess the features of the base matrix disclosed above in this invention.

Further, the decoder above may possess the following features: it further includes an extension module for extending the base matrix corresponding to the current code size according to the extension factor and the basic permutation matrix so as to get the parity check matrix of the LDPC code, according to which, said decoding operation module completes the decoding operation.

Further, the decoder above may possess the following features: said storage module stores the unique base matrix corresponding to each code size; said decoder also includes a correction module, which is for reading the base matrix from the storage module according to the code size of the current data stream, correcting the non-minus values in the matrix and then handing over the same to the following modules for processing; the correction pattern adopted in the correction is the one used for constructing the base matrix; the unique base matrix may possess the features of the unique base matrix disclosed above in this invention.

In conclusion, this invention provides a LDPC code with particular code rate and particular girth (such as 6, 8 and 10), whose code size can vary continuously; and also provides a method for keeping the base matrix unique and unchanged while the code size is changing, which, compared with the traditional methods, solves the problem of eliminating the short cycle of the LDPC code with particular code rate and continuously variable code size without increasing the storage capacity and algorithm complexity of the encoder/decoder. This invention improves the performances of such LDPC code under high Signal-to-noise ratio (SNR), accelerates the descending speed of the BER curve, eliminates the error floor of such LDPC code, and has a universal applicability. The LDPC code constructed based on the identity matrix and its cyclic shift matrices fully considers the influence of the girth on the code performance and the influence of the code size on the girth, so that the LDPC code reaches its best performance, and is able to perform ideally under high SNR. This invention also has a wide applicability, it is compatible well with construction methods considering other factors of the LDPC code (mainly the degree distribution and linear time encoding).

Hereinafter, the invention will be illustrated in detail in connection with the drawings and embodiments, which, however, will not serve as limitation to this invention.

DESCRIPTION OF THE DRAWINGS

FIG. 6 is a schematic view showing that four cyclic shift matrixes of identity matrix constitute a short cycle of length 4 in H;

FIG. 7 is a schematic view showing that six cyclic shift matrixes of identity matrix constitute a short cycle of length 6 in H;

FIG. 8 is a schematic view showing that eight cyclic shift matrixes of identity matrix constitute a short cycle of length 8 in H;

FIG. 9 is a schematic view of extend matrixes of the short cycles of length 4 and length 8 of 2×2 base matrix with z=4;

PREFERRED EMBODIMENTS OF THE INVENTION

Figure 1:
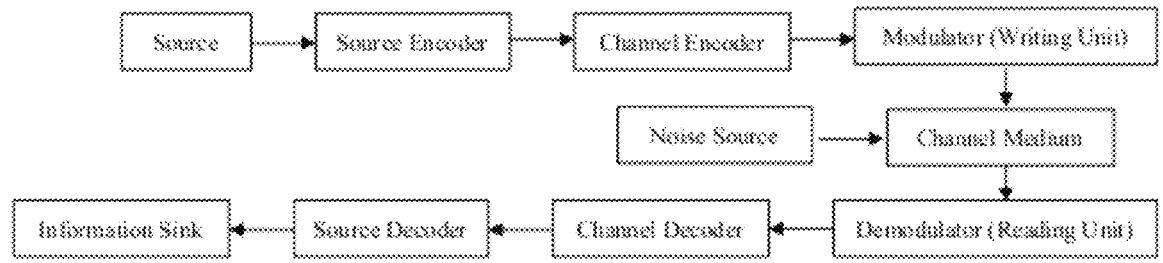
FIG. 1 is a module diagram of digital communication system.
Figure 2:
FIG. 2 is a schematic view of a short cycle of length 4 in bi-partite graph.

Hereinafter, the embodiments of technical schemes will be further described in detail in combination with the drawings:

FIG. 2 is the schematic view of the short cycle with length 4 in bi-partite graph. As illustrated in the figure, the thickened solid line denotes that the information bits $x_1$, $x_2$ and the check bits $c_1$, $c_2$ constitute a cycle with length 4.

Figure 3:
FIG. 3 is a schematic view of a short cycle of length 6 in bipartite graph.

FIG. 3 is the schematic view of the short cycle with length 6 in bi-partite graph. As illustrated in the figure, the thickened solid line denotes that the information bits $x_1$, $x_2$, $x_3$ and the check bits $c_1$, $c_2$, $c_4$ constitute a cycle with length 6.

The concept of girth is used to quantitatively describe the short cycles in the bi-partite graph. According to graph theory, the girth of the bi-partite graph refers to the length of the shortest cycle in the graph, for instance, for a bi-partite graph having cycles with 6, 8, 10, 12 and even longer lengths, its girth will be 6. In the bi-partite graph, the girth at a node u refers to the length of the shortest cycle passing through the node u, for instance, for a node u having cycles with 8, 10, 12 and even longer lengths passing through, its girth will be 8. In the bi-partite graph, the girth at an edge e refers to the length of the shortest cycle passing through the edge e, for instance, for an edge e having cycles with 8, 10, 12 and even longer lengths passing through, its girth will be 8.

The girth of a variable node refers to the length of the shortest path, which is equal to the minimum iteration times of transmitting information from the node back to the node itself. Before the actual iteration times reaches the minimum iteration times, the information connecting with the node can be transmitted preferably to the remained part of the bi-partite graph. The larger the girth of a variable node is, the less the positive feedback information of transmitting the information from the variable node to itself is, and the better the decoding performance is. Therefore, making the girth of variable nodes as large as possible is conducive to improving the code performance.

The short cycles in the bi-partite graph destroy the performance of the LDPC codes. The check matrix of LDPC code is represented by a bi-partite graph. There is a one-to-one corresponding relationship between the bi-partite graph and the check matrix. A M*N parity check matrix H defines that each codeword having N bits satisfies constraint of M parity check sets. A bi-partite graph contains N variable nodes, with each node corresponding to one bit in the X; it also contains M parity check nodes, with each node corresponding to one parity check in the H. The check node will be connected to the variable node which is to be checked. Specifically speaking, when the $m^{th}$ check relates to the $n^{th}$ bit, i.e. $H_{m,n}=1$, there will be a line connecting the check node m and the bit node n. The reason why it is called bi-partite graph is exactly that it includes two kinds of nodes, i.e. variable node and check node. In the bi-partite graph, nodes of the same kind will not be connected, and the total number of the edges is equal to the number of non-zero elements in the check matrix.

FIG. 2 illustrates that $x_1$, $x_2$ contact with each other through the cycle with length 4. FIG. 3 illustrates that $x_1$, $x_2$, $x_3$ contact with each other through the cycle with length 6. However, the information transmission decoding algorithm of LDPC code assumes that the variable nodes are independent from each other, therefore, the existence of short cycles inevitably destroys the assumption of independency, greatly reducing the decoding performance. In fact, the existence of the short cycles with lengths 4 and 6 makes the variable nodes frequently transmit positive feedback information to itself during the process of iteration decoding, which is not expected by the iteration decoding. It's well known that turbo code is also decoded iteratively, using interleaver to reduce the positive feedback effect. For the cycle free Tanner graph, the information transmission algorithm would result in optimal decoding, while the existence of short cycles makes the information transmission algorithm a sub-optimal iteration decoding algorithm. In fact, the longer the length of the shortest cycle is, the more the information transmission algorithm approaching to the optimal algorithm.

Figure 4:
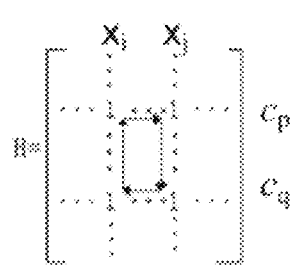
FIG. 4 is a schematic view of a short cycle of length 4 in check matrix.

FIG. 4 is the schematic view of the short cycle with length 4 in the check matrix, illustrating the normal form of the short cycle with length 4 appearing in the LDPC code check matrix.

Figure 5:
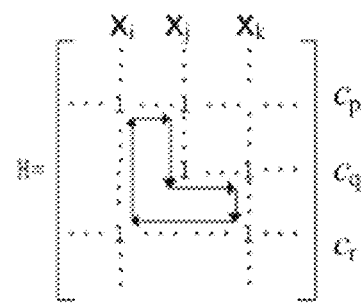
FIG. 5 is a schematic view g of a short cycle of length 6 in check matrix.

FIG. 5 is the schematic view of the short cycle with length 6 in the check matrix, illustrating the normal form of the short cycle with length 6 appearing in the LDPC code check matrix.

It is obvious that the short cycles in the bi-partite graph of LDPC code will worsen the performance of LDPC code, therefore, no matter for the regular code or irregular code, finding an algorithm to eliminate the short cycles are quite important.

To sum up, the principle for constructing the LDPC code with short cycles as few as possible is as follows: firstly, the length girth of the shortest cycle of the chosen code should be as large as possible; secondly, for the codes with the same girth, the number of the shortest cycles of the chosen code should be as few as possible.

FIG. 6 is the schematic view showing that four cyclic shift matrixes of identity matrix constitute the short cycle with length 4 in H.

The parity check matrix H of LDPC code is set as (M×z)×(N×z) matrix. It consists of M×N block matrices, each block matrix being different powers of z×z basic permutation matrix, and each is the cyclic matrix of identity matrix. Each block matrix can be uniquely identified by such powers. For H, if each block matrix is substituted by its power, a matrix $H_b$ with the power of M×N will be obtained. Here, $H_b$ is defined as the base matrix of H; since H can be obtained by extending $H_b$, the parity check matrix H is also called the extend matrix of $H_b$. Based on the definition of the base matrix, given an extension factor (an integer z greater than 1), the base matrix and the parity check matrix are essentially same, with the base matrix being only the compressed form of the parity check matrix. For convenient description in the following research, this invention defines that the girth of the base matrix is rightly the girth of its extend matrix under the condition that the extension factor is given, the girth of the base matrix is an abbreviatory expression.

It needs to specify that one power j in the base matrix identifies uniquely a z×z matrix obtained through shifting one identity matrix cyclically right for j bits, wherein, j is a random positive integer greater than 0. In the following text, the cycle shift is default as right shift.

The parity check matrix of this kind of LDPC code can be defined as:

$$H = \begin{bmatrix} P_{0,0} & P_{0,1} & P_{0,2} & \ldots & P_{0,n_b-2} & P_{0,n_b-1} \\ P_{1,0} & P_{1,1} & P_{1,2} & \ldots & P_{1,n_b-2} & P_{1,n_b-1} \\ P_{2,0} & P_{2,1} & P_{2,2} & \ldots & P_{2,n_b-1} & P_{2,n_b-1} \\ \vdots & \vdots & \vdots & \ldots & \vdots & \vdots \\ P_{m_b-1,0} & P_{m_b-1,1} & P_{m_b-1,2} & \ldots & P_{m_b-1,n_b-2} & P_{m_b-1,n_b-1} \end{bmatrix} = P^{H_b}$$

P is N×N basic cycle permutation matrix:

$$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}$$

If z is given, a M×N base matrix $H_b$ can be extended uniquely to a extend matrix H. It can be known from analysis that the size of the extend matrix can be changed by adjusting the dimension z of the basic permutation matrix, therefore, based on the base matrix, a set of LDPC codes with continuously variable code sizes under same code rate and same distribution degree can be constructed.

The following is an example of a 6×12 LDPC code with a code rate of ½ and is based on identity matrix and its cycle shift matrix:

$$H = \begin{bmatrix} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ \hline 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{bmatrix}$$

It can be known by analyzing the above formula that the parity check matrix H of the LDPC code above can be divided into eight block matrixes, each of which can be regarded as cycle shift matrix of a 3×3 identity matrix. The check matrix can be determined by only knowing two parameters, the first is the dimension of the identity matrix, the second is the cycle shift bits corresponding to each block matrix.

If I represents the identity matrix, the dimension of the identify check matrix can be defined as $I_{dims}$. Suppose one matrix is obtained by shifting the identity matrix circularly i bits, it can be represented as i; the identity matrix can be regarded as a matrix obtained by shifting the identity matrix circularly 0 bit, so it can be represented as 0; and the 0 matrix is usually represented as −1. Thus, the check matrix above can be represented with the following parameter $I_{dims}$ and a 2×4 matrix $H_b$:

$$I_{dims} = 3 \text{ and } H_b = \begin{bmatrix} 0 & 1 & 0 & -1 \\ 2 & 1 & 2 & 1 \end{bmatrix}$$

As shown in FIG. 6, by analyzing the check matrix and the topology structure of the bi-partite graph, it can be known that only when the short cycle with length 4 appears in the base matrix $H_b$, can the short cycle with length 4 or larger length possibly appear in the extend matrix H of $H_b$.

Through verification by computer simulation and mathematic deduction, the following conclusion can be achieved:

Z refers to even, the power elements i, j, k, l corresponding to four z×z block matrixes $P_i$, $P_j$, $P_k$, $P_l$ constitute the short cycle with length 4 in $H_b$. If mod(i−j+k−l,z)=0, $P_i$, $P_j$, $P_k$, $P_l$ constitute the short cycle with length 4 in H; if mod(i−j+k−l, z/2)=0, $P_i$, $P_j$, $P_k$, $P_l$ constitute the short cycle with length 8 in H; in other cases, $P_i$, $P_j$, $P_k$, $P_l$ constitute the short cycle with length 12 in H or do not constitute any short cycle.

FIG. 7 is the schematic view showing that six cyclic shift matrixes of the identity matrix constitute the short cycle with length 6 in H. As shown in the figure, by analyzing the check matrix and the topology structure of the bi-partite graph, it can be concluded that only when the short cycle with length 6 appears in the base matrix $H_b$, can the short cycle with length 6 or larger length possibly appear in the extend matrix H of $H_b$. See the following conclusion:

Z refers to even, the power elements i, j, k, l, m, n corresponding to the six z×z block matrixes $P_i$, $P_j$, $P_k$, $P_l$, $P_m$, $P_n$ constitute the short cycle with length 6 in $H_b$. If mod(i−j+k−l+m−n,z)=0, $P_i$, $P_j$, $P_k$, $P_l$, $P_m$, $P_n$ constitute the short cycle with length 6 in H; if mod(i−j+k−l+m−n,z/2)=0, $P_i$, $P_j$, $P_k$, $P_l$, $P_m$, $P_n$, constitute the short cycle with length 10 in H; in other cases, $P_i$, $P_j$, $P_k$, $P_l$, $P_m$, $P_n$ constitute the short cycle with length $\geq$12 in H or do not constitute any short cycle.

FIG. 8 is the schematic view showing that eight cyclic shift matrixes of the identity matrix constitute the short cycle with length 8 in H. As shown in the figure, by analyzing the check matrix and the topology structure of the bi-partite graph, it can be concluded that only when the short cycle with length 8 appears in the base matrix $H_b$, can the short cycle with length 8 or even larger length possibly appear in the extend matrix H of $H_b$. See the following conclusion:

Z refers to even, the power elements i, j, k, l, m, n, s, t corresponding to the eight z×z block matrixes $P_i$, $P_j$, $P_k$, $P_l$, $P_m$, $P_n$, $P_s$, $P_t$ constitute the short cycle with length 8 in $H_b$; If mod(i−j+k−l+m−n+s−t,z)=0, $P_i$, $P_j$, $P_k$, $P_l$, $P_m$, $P_n$, $P_s$, $P_t$ constitute the short cycle with length 8 in H; in other cases, $P_i$, $P_j$, $P_k$, $P_l$, $P_m$, $P_n$, $P_s$, $P_t$ constitute the short cycle with length 12 in H or do not constitute any short cycle.

FIG. 9 is the schematic view of the extend matrixes of short cycles with lengths 4 and 8 of the 2×2 base matrix with z=4. In this figure, $$z = 4, H_b = \begin{bmatrix} 0 & 2 \\ 1 & 3 \end{bmatrix},$$

mod(0−2+3−1,4)=0

From the above, it can be known that there is a short cycle with length 4.

$$z = 4, H_b = \begin{bmatrix} 0 & 0 \\ 0 & 2 \end{bmatrix},$$

mod(0−0+2−0,4)=2

From the above, it can be known that there is a short cycle with length 8.

In practical application, the extend matrix is obtained by extending the base matrix. The dimension z of the cyclic permutation matrix is usually even, and in the following text, z will be default as even. By analyzing the topology of the check matrix, it can be known that the z×z block matrixes in extend matrix corresponds to the elements of the base matrix one by one. If some elements in the base matrix do not constitute the short cycle, the block matrixes corresponding to these elements will also not constitute the short cycle in the extend matrix. Therefore, only the case that the short cycle appears in the base matrix needs to be considered when studying the short cycle of the extend matrix.

Based on the structure above, the matrix structure that the LDPC check matrix H should possess under different girths can be obtained. Assuming the extension factor z is even, then there is the following conclusion:

The sufficient and necessary condition for LDPC parity check matrix girth$\geq$6 is: in its base matrix, for random elements i, j, k, l which construct in anticlockwise (when in clockwise, the effect is same) the short cycle with length 4, there is always mod(i−j+k−l, z)$\neq$0.

The sufficient and necessary condition for LDPC parity check matrix girth$\geq$8 is: in its base matrix, for random elements i, j, k, l which construct in anticlockwise the short cycle with length 4, there is always mod(i−j+k−l, z)$\neq$0; and for random elements i, j, k, l, m, n which construct in anticlockwise the short cycle with length 6, there is always mod(i−j+k−l+m−n, z)$\neq$0.

The sufficient and necessary condition for LDPC parity check matrix girth$\geq$10 is: in its base matrix, for random elements i, i, k, l which construct in anticlockwise the short cycle with length 4, there is always mod(i−j+k−l, z/2)$\neq$0; for random elements i, j, k, l, m, n which construct in anticlockwise the short cycle with length 6, there is always mod(i−j+k−l+m−n, z)$\neq$0; and for random elements i, j, k, l, m, n, s, t which construct in anticlockwise the short cycle with length 8, there is always mod(i−j+k−l+m−n+s−t, z)$\neq$0.

When girth≧10, the increasing of girth has little effect in improving the decoder performance. Therefore, the invention only considers eliminating the short cycles with lengths 4, 6 and 8.

Therefore, under particular code sizes, the parity check matrix of the encoder and decoder of LDPC code designed in the invention aims to satisfy the above inequation. In fact, when the code size is short, the LDPC encoder/decoder with girth=6 can be designed in the invention; when the code size is medium, the LDPC encoder/decoder with girth=8 can be designed in the invention; when the code size is large, then the LDPC encoder/decoder with girth=10 can be designed. Different code sizes correspond to different base matrixes.

Based on the above relationship, this invention provides a specific embodiment for constructing LDPC code parity check matrix with large girth, including the following steps of:

Step 1, determining the code rate, code size, and number of parity bits of the base matrix of the LDPC code to be constructed;

Step 2, determining the row weight and column weight of the base matrix of the LDPC code to be constructed;

If the LDPC code to be constructed is regular code, its row weight and column weight can be determined directly; if the LDPC code to be constructed is irregular code, the degree distribution needs to be determined by density evolution, such factors as SNR threshold, iteration convergence speed, and algorithm complexity need to be taken into full consideration for finally choosing an appropriate degree distribution, then based on the degree distribution, the row weight vector and column weight vector of the matrix can be obtained.

Step 3, based on the row weight vector and column weight vector, constructing an original base matrix H with girth as large as possible and number of the shortest cycles as few as possible by Bit-filling algorithm;

Since the original base matrix is usually small, the girth of the original base matrix is 4, the key is to reduce to the largest extent the number of short cycles with length 4. The original base matrix only consists of 0,1, which reflects such important features as degree distribution, code rate of the LDPC code that finally needs to be constructed. For the Bit-filling method, please refer to *LDPC Code and its Application in $4^{th}$ Mobile Communication System* (a master thesis) by XU JUN, NanJiang University of Posts and Telecommunications, 2003; or J. Campello et al., Extended Bit-Filling and LDPC Codes Design, Proc. IEEE Globecom Conf. San Antonio, Tex., Nov. 2001. Certainly, this invention can also employ other methods that are able to construct effectively the original base matrix with girth as large as possible and number of the shortest cycles as few as possible.

Step 4, based on the original base matrix constructed, choosing appropriate elements from the set $\{0, 1, 2, L, z-1\}$ to place on all "1" positions in the matrix till all the "1" positions have been filled in, and finally obtaining the base matrix $H_b$; in order to construct the check matrix structure according with liner time coding, the part of the base matrix corresponding to parity bit usually adopting a quasi-lower triangular structure;

Step 5, extending the base matrix according to the known extension factor z to get the required parity check matrix of LDPC code, for verifying whether the obtained degree distribution and the girth of the parity check matrix of LDPC code, and parameters and features of other codes satisfy the requirements, and testing the performance of LDPC code by simulation.

The detailed Bit-filling method in step 3 is as follows: firstly, determining the row weight vector and column weight vector of the original base matrix, then placing "1"s into the check matrix one by one, while satisfying the constrain condition of short cycle (i.e. the number of the short cycles with length 4 should be as few as possible) and the constrain condition of degree distribution (i.e. the predetermined row weight and column weight should not be exceeded) must be satisfied. For Bit-filling algorithm, "1"s are put into the check matrix one by one from the first column to the last column; when filling a "1" in a column, there are several places that can be filled with the "1", choosing from these places the one that forms the minimum number of the short cycles with length 4 to be filled with the "1", and demanding the constrain of degree distribution. Supposing the number of the edge of the bi-partite graph is 1, the matrix is generated successfully when E "1"s are placed in the check matrix successfully.

In step 4, the method for constructing the base matrix of LDPC code with girth as large as possible is similar to the course of bit filling, the base matrix is obtained by choosing value from set $\{0, 1, 2, \ldots, z-1\}$ to be filled into the "1" places in the original base matrix. Now, the key of the problem is how to choose an appropriate element from set $\{0, 1, 2, L, z-1\}$ to the "1" position in the original base matrix.

Supposing the elements in set $\{0, 1, 2, L, z-1\}$ have already been filled into some of the "1" positions in the original base matrix, part of the base matrix $H_c$ having been constructed is obtained, and the girth of the extend matrix corresponding to $H_c$ is ≧10, now an appropriate value needs to be chosen to add to row x0, column y0 in $H_c$.

Figure 10:
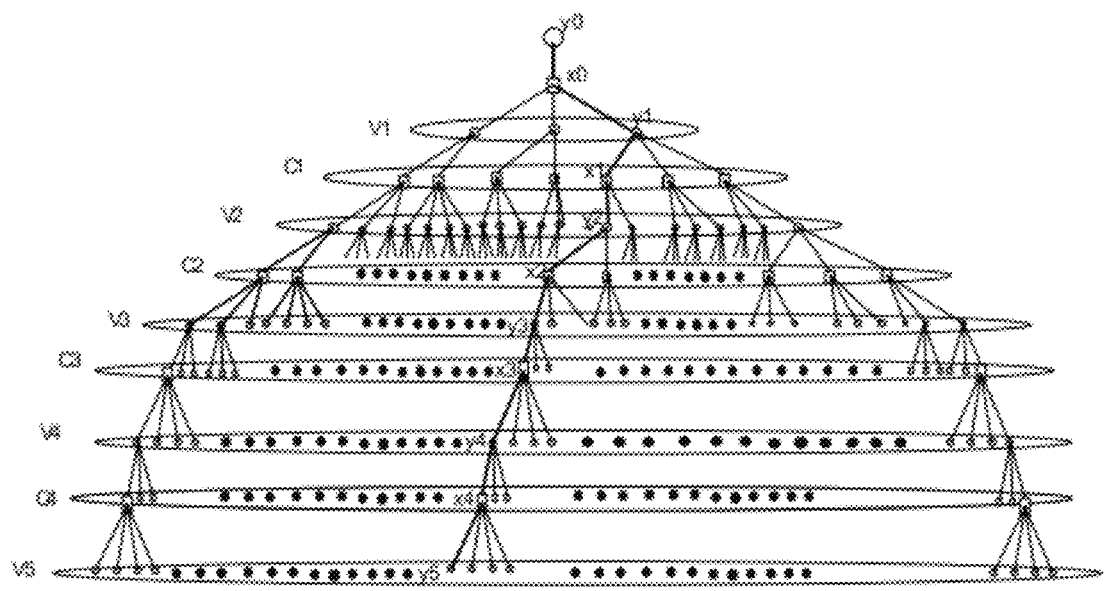
FIG. 10 is a schematic view of the bipartite graph expanded after an edge corresponding to the element of row x0, column y0 starts.

FIG. 10 is the schematic view of the bipartite graph expanded by starting from the edge corresponding to the element of row x0 and column y0. For the bi-partite graph of base matrix $H_c$, the bi-partite graph starting from the edge corresponding to the element of row x0 and column y0 can be obtained by starting from the edge corresponding to the element of row x0 and column y0 and going through all possible paths. In the figure, the circle stands for the variable node, and the block stands for the check node. V1 refers to the neighboring variable nodes set having a distance of 2 from y0; C1 refers to the neighboring check nodes set having a distance of 3 from y0; V2 refers to the neighboring variable nodes set having a distance of 4 from y0; C2 refers to the neighboring check nodes set having a distance of 5 from y0; V3 refers to the neighboring variable nodes set having a distance of 6 from y0; C3 refers to the neighboring check nodes set having a distance of 7 from y0; V4 refers to the neighboring variable nodes set having a distance of 8 from y0; C4 refers to the neighboring check nodes set having a distance of 9 from y0; V5 refers to the neighboring variable nodes set having a distance of 10 from y0. When y0 appears in V2, the short cycle with length 4 appears; when y0 appears in V3, the short cycle with length 6 appears; when y0 appears in V4, the short cycle with length 8 appears; when y0 appears in V5, the short cycle with length 10 appears. Thus, any short cycle including the edge corresponding to the element of row x0 and column y0 will represent in the partial bi-partite graph. This figure can also be used to determine the girth of the bi-partite graph of the check matrix.

In FIG. 10, it is assumed that the bold black line refers to a random path starting from the edge corresponding to the element of row x0 and column y0. In the check matrix, finding a non-zero element in horizontal direction by starting from row x0 and column y0, and setting its position to be row x0 and column y1; then finding a non-zero element in vertical direction, and setting its position to be row x1 and column y1; then finding a non-zero element in horizontal direction, and setting its position to be row x1 and column y2; then finding a non-zero element in vertical direction, and setting its position to be row x2 and column y2; and so on and so forth, obtaining the path of the bi-partite graph starting from the edge corresponding to the element of row x0 and column y0, said path being marked with bold black line in the figure.

Figure 11:
FIG. 11 is a schematic view of a random path starting from the edge corresponding to the element of row x0, column y0 in the bipartite graph of FIG. 10.

FIG. 11 is the schematic view of any path starting from the edge corresponding to the element of row x0 and column y0 in the bi-partite graph of FIG. 10. According to the decoding information transmission algorithm of LDPC code, there is inevitably y1≠y0. When y2=y0, it can be known that y0, x0, y1, x1 constitute a short cycle with length 4; when y2≠y0 and y3=y0, it can be known that y0, x0, y1, x1, y2, x2 constitute a short cycle with length 6; when y2, y3≠y0 and y4=y0, it can be known that y0, x0, y1, x1, y2, x2, y3, x3 constitute a short cycle with length 8; and so on and so forth. In short, by starting from the edge corresponding to the element of row x0 and column y0, all short cycles possibly including the edge can be found.

Figure 12:
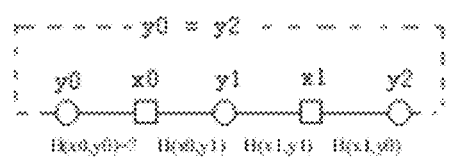
FIG. 12 is a schematic view showing the path of FIG. 11 constitutes the short cycle of length 4.

FIG. 12 is the schematic view showing that the path illustrated in FIG. 11 constitutes the short cycle with length 4. In part of the base matrix Hc having been constructed, there is a path as shown in FIG. 11 by starting from the edge corresponding to the element of row x0 and column y0, if y0=y2 is satisfied, it can be known that the short cycle with length 4 as shown in FIG. 12 is constituted. According to the corresponding relationship between the check matrix and bipartite graph, i.e. every edge of the bi-partite graph corresponds uniquely to a non-zero element in the matrix, it can be known that H(x0, y1) corresponds to the edge from check node x0 to variable node y1, H(x1,y1) corresponds to the edge from check node x1 to variable node y1, H(x1,y0) corresponds to the edge from check node x1 to variable node y0, H(x0,y0) corresponds to the edge from check node x0 to variable node y0, in which, H(x0,y0), H(x0,y1), H(x1,y1), H(x1,y1) belong to the set {0, 1, 2, ..., z-1}; H(x0,y1), H(x1,y1), H(x1,y1) are known, and H(x0,y0) is unknown and needs to be filled in. According to the above conclusion, it can be known that if:

$$\mod(H(x0,y0)-H(x0,y1)+H(x1,y1)-H(x1,y0),z)\neq 0 \quad (1)$$

the short cycle with length 4 in the base matrix will not result in the emergence of the short cycle with length 4 in the extend matrix; if:

$$\mod(H(x0,y0)-H(x0,y1)+H(x1,y1)-H(x1,y0),z/2)\neq 0 \quad (2)$$

the short cycle with length 4 in the base matrix will not result in the emergence of the short cycle with length 8 in the extend matrix.

Figure 13:
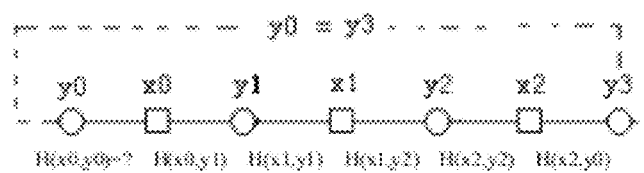
FIG. 13 is a schematic view showing the path of FIG. 11 constitutes the short cycle of length 6.

FIG. 13 is the schematic view showing that the path illustrated in FIG. 11 constitutes the short cycle with length 6. In part of the base matrix Hc constructed, there is a path as shown in FIG. 11 by starting from the edge corresponding to the element of row x0 and column y0, if y0=y3 is satisfied, it can be known that the short cycle with length 6 as shown in FIG. 13 is constituted. According to the above conclusion, it can be known that if.

$$\mod(H(x0,y0)-H(x0,y1)+H(x1,y1)-H(x1,y2)+H(x2,y2)+H(x2,y0),z)\neq 0 \quad (3)$$

the short cycle with length 6 in the base matrix will not result in the emergence of the short cycle with length 6 in the extend matrix; If:

$$\mod(H(x0,y0)-H(x0,y1)+H(x1,y1)-H(x1,y2)+H(x2,y2)+H(x2,y0),z\,2)\neq 0 \quad (4)$$

the short cycle with length 6 in the base matrix will not result in the emergence of the short cycle with length 10 in the extend matrix.

Figure 14:
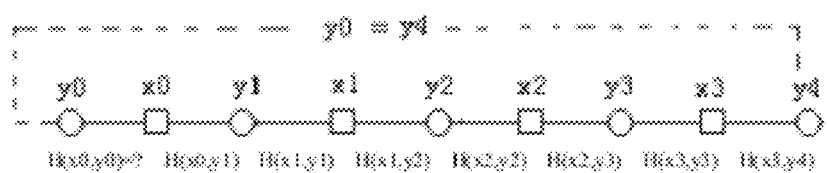
FIG. 14 is a schematic view showing the path of FIG. 11 constitutes the short cycle of length 8.

FIG. 14 is the schematic view showing that the path illustrated in FIG. 11 constitutes the short cycle with length 8. In part of the base matrix Hc constructed, there is a path as shown in FIG. 11 by starting from the edge corresponding to the element of row x0 and column y0, if y0-y4 is satisfied, it can be known that the short cycle with length 8 as shown in FIG. 14 is constituted. According to the above conclusion, it can be known that if:

$$\mod(H(x0,y0)-H(x0,y1)+H(x1,y1)-H(x1,y2)+H(x2,y2)-H(x2,y3)+H(x3,y3)-H(x3,y4),z)\neq 0 \quad (5)$$

the short cycle with length 8 in the base matrix will not result in the emergence of the short cycle with length≧10 in the extend matrix.

By the analysis above, the method for choosing an appropriate value to be added to row x0 and column y0 in the part of the base matrix having been constructed is as follows:

(11) taking part of the base matrix Hc having been constructed as the object, starting from the edge corresponding to the element of row x0 and column y0, going through all possible paths, and finding all of the short cycles; when in practical construction, the part of parity bit with the quasi-lower triangle structure can be constructed first;

(12) if the short cycle with length 4 of the bi-partite graph corresponding to Hc appears, the values chosen have to ensure the tenability of formula (1), so as to ensure the extend matrix girth>4; if the short cycle with length 6 of the bi-partite graph corresponding to Hc appears, the values chosen have to ensure the tenability of formula (3), so as to ensure the extend matrix girth>6; if the short cycle with length 4 of the bi-partite graph corresponding to Hc appears, the values chosen have to ensure the tenability of formula (2), and if the short cycle with length 8 of the bi-partite graph corresponding to Hc appears, the values chosen have to ensure the tenability of formula (5), so as to ensure the extend matrix girth>8. Thus, the extend matrix with girth=10 can be constructed, if the value in the last step can not be found, the extend matrix with girth=8 can be constructed. In short, the length of the shortest cycle passing through the position of the element should be as large as possible.

(13) repeating the above steps (11) and (12), the base matrix able to satisfy the demand for the girth under all code sizes can be obtained till the choosing of values for all non-zero elements is completed.

In actual simulation, it is found that the code size and the girth correlate each other closely, the larger the code size is, the wider the value range of $\{0, 1, 2, \ldots z-1\}$ is, the easier to find the suitable value for filling and construct the code with large girth; vice versa.

Hereinafter, the embodiment 1 of the check matrix of encoder and decoder of LDPC code designed by the invention will be presented, in which, the base matrix is not unique, a LDPC code with code rate of ½ and code size varying continuously from 576 to 2304 by an interval of 96. According to the method of the invention, an original base matrix of 12×24 is designed, which reflects the code rate and degree distribution of the matrix to be constructed. It is a semi-regular check matrix, the part of the check matrix corresponding to information bits has a regular structure, and both of the row weight and column weight are 4; the part of the check matrix corresponding to parity bits has a double lower triangle structure aiming for realizing the direct linear time coding.

Herein, the value of z is variable, depending on the codeword size N needing to be designed, $z=N/N_b$, $N_b$ is the codeword size of the base matrix which is 24 here. Therefore, this invention believes that the value of the elements in the base matrix can vary with code size, if the code size increases, the value of z will increase, the choosing range of the value to be filled in the original base matrix will be wider, and the LDPC code with large girth can be constructed more easily, so that the LDPC code constructed is ensured to effectively overcome the influence of the short cycle over the code performance. For example, in standard IEEE802.16e, supposing code rate is ½, the base matrix is a 12×24 matrix, the extension factor z can be chosen value from 24 to 96 continuously, then the LDPC code whose codeword length varies continuously from 576 to 2304 by the interval of 96 can be generated.

The base matrix in this embodiment is no longer unique, each code corresponds to a different base matrix, but the original base matrixes are the same. Thus, the LDPC code $$OriginalBaseMatrixH = \begin{bmatrix} 1 & 0 & 0 & 1 & 0 & 0 & 0 & 1 & 0 & 1 & 0 & 0 & 1 & 1 & 0 & 0 & 0 & 0 & 0 & 0 & 0 & 0 & 0 & 0 \\ 1 & 0 & 0 & 0 & 1 & 1 & 0 & 0 & 1 & 0 & 0 & 0 & 0 & 1 & 1 & 0 & 0 & 0 & 0 & 0 & 0 & 0 & 0 & 0 \\ 0 & 1 & 0 & 0 & 1 & 0 & 0 & 0 & 1 & 0 & 1 & 0 & 0 & 0 & 1 & 1 & 0 & 0 & 0 & 0 & 0 & 0 & 0 & 0 \\ 0 & 0 & 1 & 0 & 1 & 0 & 0 & 1 & 0 & 0 & 1 & 0 & 0 & 0 & 0 & 1 & 1 & 0 & 0 & 0 & 0 & 0 & 0 & 0 \\ 0 & 0 & 0 & 1 & 0 & 1 & 0 & 0 & 0 & 1 & 0 & 1 & 0 & 0 & 0 & 0 & 1 & 1 & 0 & 0 & 0 & 0 & 0 & 0 \\ 0 & 0 & 1 & 0 & 0 & 0 & 1 & 0 & 0 & 1 & 0 & 1 & 0 & 0 & 0 & 0 & 0 & 1 & 1 & 0 & 0 & 0 & 0 & 0 \\ 0 & 1 & 0 & 0 & 0 & 1 & 1 & 1 & 0 & 0 & 0 & 0 & 1 & 0 & 0 & 0 & 0 & 0 & 1 & 1 & 0 & 0 & 0 & 0 \\ 0 & 0 & 1 & 0 & 0 & 1 & 0 & 0 & 0 & 0 & 1 & 1 & 0 & 0 & 0 & 0 & 0 & 0 & 0 & 1 & 1 & 0 & 0 & 0 \\ 0 & 1 & 1 & 1 & 0 & 0 & 0 & 0 & 1 & 0 & 0 & 0 & 0 & 0 & 0 & 0 & 0 & 0 & 0 & 0 & 1 & 1 & 0 & 0 \\ 1 & 0 & 0 & 0 & 0 & 0 & 1 & 0 & 1 & 1 & 0 & 0 & 0 & 0 & 0 & 0 & 0 & 0 & 0 & 0 & 0 & 1 & 1 & 0 \\ 1 & 1 & 0 & 0 & 0 & 0 & 0 & 0 & 0 & 0 & 1 & 1 & 0 & 0 & 0 & 0 & 0 & 0 & 0 & 0 & 0 & 0 & 1 & 1 \\ 0 & 0 & 0 & 1 & 1 & 0 & 1 & 1 & 0 & 0 & 0 & 0 & 1 & 0 & 0 & 0 & 0 & 0 & 0 & 0 & 0 & 0 & 0 & 1 \end{bmatrix}$$

According to the requirements for code design, the invention needs to choose value from $\{0, 1, 2, \ldots, z-1\}$ to fill in the original basic check matrix, all 0 elements of other matrixes are filled with −1. According to the requirements for designing the semi-regular matrix, all "1"s in the right half of the matrix are required to be replaced by "0"s, while the left half of the matrix has to be filled with according to the method provided by the invention.

with particular code rate and variable code size needs to adjust the value of the base matrix under different code sizes, i.e. the positions of the non-minus 1 element in the base matrixes with different code sizes are the same, but the values of these positions are not always the same.

If a LDPC code with codeword length N=576 needs to be constructed, and $z=N/N_b=576/24=24$, then the base matrix is constructed as follows, ensuring that the girth of the matrix constructed is 8:

$$BaseMatrixH1 = \begin{bmatrix} 3 & -1 & -1 & 11 & -1 & -1 & -1 & 19 & -1 & 16 & -1 & -1 & 0 & 0 & -1 & -1 & -1 & -1 & -1 & -1 & -1 & -1 & -1 & -1 \\ 4 & -1 & -1 & -1 & 15 & 17 & -1 & -1 & 14 & -1 & -1 & -1 & -1 & 0 & 0 & -1 & -1 & -1 & -1 & -1 & -1 & -1 & -1 & -1 \\ -1 & 11 & -1 & -1 & 17 & -1 & -1 & -1 & 5 & -1 & 13 & -1 & -1 & -1 & 0 & 0 & -1 & -1 & -1 & -1 & -1 & -1 & -1 & -1 \\ -1 & -1 & 16 & -1 & 3 & -1 & -1 & 12 & -1 & -1 & 17 & -1 & -1 & -1 & -1 & 0 & 0 & -1 & -1 & -1 & -1 & -1 & -1 & -1 \\ -1 & -1 & -1 & 5 & -1 & 7 & -1 & -1 & -1 & 21 & -1 & 11 & -1 & -1 & -1 & -1 & 0 & 0 & -1 & -1 & -1 & -1 & -1 & -1 \\ -1 & -1 & 6 & -1 & -1 & -1 & 21 & -1 & -1 & 9 & -1 & 9 & -1 & -1 & -1 & -1 & -1 & 0 & 0 & -1 & -1 & -1 & -1 & -1 \\ -1 & 6 & -1 & -1 & -1 & 15 & 8 & 16 & -1 & -1 & -1 & -1 & 0 & -1 & -1 & -1 & -1 & -1 & 0 & 0 & -1 & -1 & -1 & -1 \\ -1 & -1 & 18 & -1 & -1 & 0 & -1 & -1 & -1 & -1 & 7 & 16 & -1 & -1 & -1 & -1 & -1 & -1 & -1 & 0 & 0 & -1 & -1 & -1 \\ -1 & 14 & 20 & 23 & -1 & -1 & -1 & -1 & 5 & -1 & -1 & -1 & -1 & -1 & -1 & -1 & -1 & -1 & -1 & -1 & 0 & 0 & -1 & -1 \\ 4 & -1 & -1 & -1 & -1 & 3 & -1 & 1 & 20 & -1 & -1 & -1 & -1 & -1 & -1 & -1 & -1 & -1 & -1 & -1 & -1 & 0 & 0 & -1 \\ 6 & 19 & -1 & -1 & -1 & -1 & -1 & -1 & -1 & 19 & 3 & -1 & -1 & -1 & -1 & -1 & -1 & -1 & -1 & -1 & -1 & -1 & 0 & 0 \\ -1 & -1 & -1 & 18 & 3 & -1 & 16 & 10 & -1 & -1 & -1 & -1 & 0 & -1 & -1 & -1 & -1 & -1 & -1 & -1 & -1 & -1 & -1 & 0 \end{bmatrix}$$

If a LDPC code with codeword length N=1512 needs to be constructed, and $z=N/N_b=152/24=48$, then the base matrix is constructed as follows, ensuring that the girth of the matrix constructed is 8:

$$BaseMatrixH2 = \begin{bmatrix} 30 & -1 & -1 & 39 & -1 & -1 & -1 & 41 & -1 & 47 & -1 & -1 & 0 & 0 & -1 & -1 & -1 & -1 & -1 & -1 & -1 & -1 & -1 & -1 \\ 16 & -1 & -1 & -1 & 20 & 15 & -1 & -1 & 46 & -1 & -1 & -1 & -1 & 0 & 0 & -1 & -1 & -1 & -1 & -1 & -1 & -1 & -1 & -1 \\ -1 & 18 & -1 & -1 & 2 & -1 & -1 & -1 & 35 & -1 & 11 & -1 & -1 & -1 & 0 & 0 & -1 & -1 & -1 & -1 & -1 & -1 & -1 & -1 \\ -1 & -1 & 7 & -1 & 40 & -1 & -1 & 46 & -1 & -1 & 28 & -1 & -1 & -1 & -1 & 0 & 0 & -1 & -1 & -1 & -1 & -1 & -1 & -1 \\ -1 & -1 & -1 & 2 & -1 & 12 & -1 & -1 & -1 & 9 & -1 & 30 & -1 & -1 & -1 & -1 & 0 & 0 & -1 & -1 & -1 & -1 & -1 & -1 \\ -1 & -1 & 15 & -1 & -1 & -1 & 5 & -1 & -1 & 31 & -1 & 40 & -1 & -1 & -1 & -1 & -1 & 0 & 0 & -1 & -1 & -1 & -1 & -1 \\ -1 & 5 & -1 & -1 & -1 & 10 & 14 & 37 & -1 & -1 & -1 & -1 & 0 & -1 & -1 & -1 & -1 & -1 & 0 & 0 & -1 & -1 & -1 & -1 \\ -1 & -1 & 12 & -1 & -1 & 16 & -1 & -1 & -1 & -1 & 10 & -1 & -1 & -1 & -1 & -1 & -1 & -1 & -1 & 0 & 0 & -1 & -1 & -1 \\ -1 & 27 & 41 & 32 & -1 & -1 & -1 & -1 & 45 & -1 & -1 & -1 & -1 & -1 & -1 & -1 & -1 & -1 & -1 & -1 & 0 & 0 & -1 & -1 \\ 36 & -1 & -1 & -1 & -1 & -1 & 19 & -1 & 6 & 14 & -1 & -1 & -1 & -1 & -1 & -1 & -1 & -1 & -1 & -1 & -1 & 0 & 0 & -1 \\ 37 & 14 & -1 & -1 & -1 & -1 & -1 & -1 & -1 & -1 & 26 & 21 & -1 & -1 & -1 & -1 & -1 & -1 & -1 & -1 & -1 & -1 & 0 & 0 \\ -1 & -1 & -1 & 30 & 12 & -1 & 27 & 17 & -1 & -1 & -1 & -1 & 0 & -1 & -1 & -1 & -1 & -1 & -1 & -1 & -1 & -1 & -1 & 0 \end{bmatrix}$$

If a LDPC code with codeword length N=2304 needs to be constructed, and $z=N/N_b=2304/24=96$, then the base matrix is constructed as follows, ensuring that the girth of the matrix constructed is 10:

$$BaseMatrixH3 = \begin{bmatrix} 59 & -1 & -1 & 39 & -1 & -1 & -1 & 72 & -1 & 85 & -1 & -1 & 0 & 0 & -1 & -1 & -1 & -1 & -1 & -1 & -1 & -1 & -1 & -1 \\ 25 & -1 & -1 & -1 & 8 & 17 & -1 & -1 & 31 & -1 & -1 & -1 & -1 & 0 & 0 & -1 & -1 & -1 & -1 & -1 & -1 & -1 & -1 & -1 \\ -1 & 51 & -1 & -1 & 11 & -1 & -1 & -1 & 3 & -1 & 48 & -1 & -1 & -1 & 0 & 0 & -1 & -1 & -1 & -1 & -1 & -1 & -1 & -1 \\ -1 & -1 & 53 & -1 & 17 & -1 & -1 & 79 & -1 & -1 & 29 & -1 & -1 & -1 & -1 & 0 & 0 & -1 & -1 & -1 & -1 & -1 & -1 & -1 \\ -1 & -1 & -1 & 92 & -1 & 77 & -1 & -1 & -1 & 21 & -1 & 43 & -1 & -1 & -1 & -1 & 0 & 0 & -1 & -1 & -1 & -1 & -1 & -1 \\ -1 & -1 & 11 & -1 & -1 & -1 & 32 & -1 & -1 & 77 & -1 & 55 & -1 & -1 & -1 & -1 & -1 & 0 & 0 & -1 & -1 & -1 & -1 & -1 \\ -1 & 46 & -1 & -1 & -1 & 6 & 79 & 16 & -1 & -1 & -1 & -1 & 0 & -1 & -1 & -1 & -1 & -1 & 0 & 0 & -1 & -1 & -1 & -1 \\ -1 & -1 & 87 & -1 & -1 & 73 & -1 & -1 & -1 & 13 & 42 & -1 & -1 & -1 & -1 & -1 & -1 & -1 & -1 & 0 & 0 & -1 & -1 & -1 \\ -1 & 87 & 6 & 38 & -1 & -1 & -1 & -1 & 47 & -1 & -1 & -1 & -1 & -1 & -1 & -1 & -1 & -1 & -1 & -1 & 0 & 0 & -1 & -1 \\ 8 & -1 & -1 & -1 & -1 & -1 & 75 & -1 & 86 & 49 & -1 & -1 & -1 & -1 & -1 & -1 & -1 & -1 & -1 & -1 & -1 & 0 & 0 & -1 \\ 93 & 13 & -1 & -1 & -1 & -1 & -1 & -1 & -1 & -1 & 8 & 88 & -1 & -1 & -1 & -1 & -1 & -1 & -1 & -1 & -1 & -1 & 0 & 0 \\ -1 & -1 & -1 & 45 & 32 & -1 & 78 & 52 & -1 & -1 & -1 & -1 & 0 & -1 & -1 & -1 & -1 & -1 & -1 & -1 & -1 & -1 & -1 & 0 \end{bmatrix}$$

Figure 15:
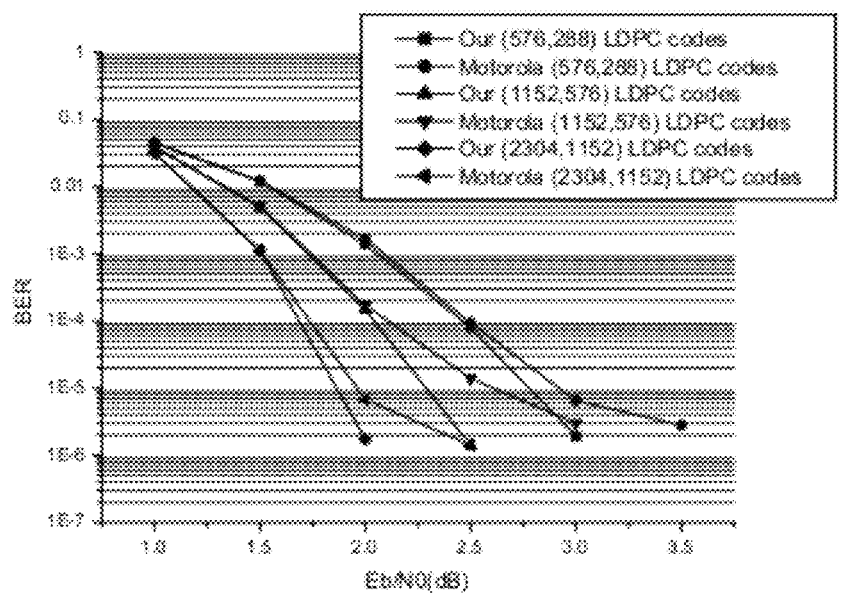
FIG. 15 is a comparison diagram between BER of the R=½ LDPC code with girth=8 or 10 constructed in embodiment 1 of the invention and the BER of the LDPC code with girth=6 constructed by 802.16e contribution.

FIG. 15 is the comparison drawing between the BER of the IDPC code with R=½ and girth=8 or 10 constructed by embodiment 1 of the invention and the BER of the LDPC code with girth=6 constructed by 16e contribution.

Figure 16:
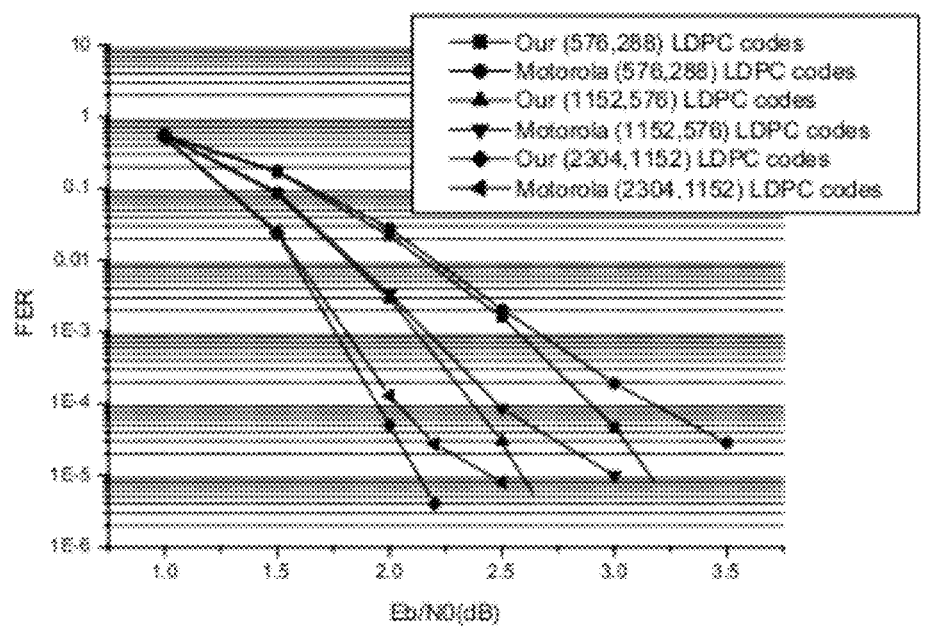
FIG. 16 is a comparison diagram between FER of the R=½ LDPC code with girth=8 or 10 constructed in embodiment 1 of the invention and the FER of the LDPC code with girth=6 constructed by 802.16e contribution.

FIG. 16 is the comparison drawing between the FER of the LDPC code with R=½ and girth=8 or 10 constructed by embodiment 1 of the invention and the FER of the LDPC code with girth=6 constructed by 16e contribution.

As shown in FIGS. 15 and 16, under the conditions that the codeword lengths are the same (taking 576,1152 and 2304 respectively), the degree distributions are the same, and parts of the check matrix corresponding to the parity check matrix are the same, the simulation demonstrates that the performance of the LDPC code with girth=8 or 10 obtained by the extension of BaseMatrixH1, BaseMatrix H2, BaseMatrixH3 is apparently better than that of the LDPC code with girth=6 obtained by the extension of base matrix provided by 802.16e contribution (Motorola IEEEC802.16-04/373r1"LDPC coding OFDMA PHY"). The LDPC code constructed in the invention eliminates the error floor of LDPC code.

Herein, different code sizes use different base matrixes, ensuring that the LDPC code with girth as large as possible is generated under different code sizes. However, since there are nineteen types of code sizes, the encoder/decoder needs to store nineteen base matrixes, which requires the encoder/decoder to possess a large storage capacity, impeding to some extent the application of the technique for eliminating short cycle.

In the following, an encoder and a decoder of the LDPC code based on identity matrix and its cyclic shift matrix designed in the invention will be described in another embodiment. The encoder and decoder are always determined uniquely by a parity check matrix H.

Figure 18:
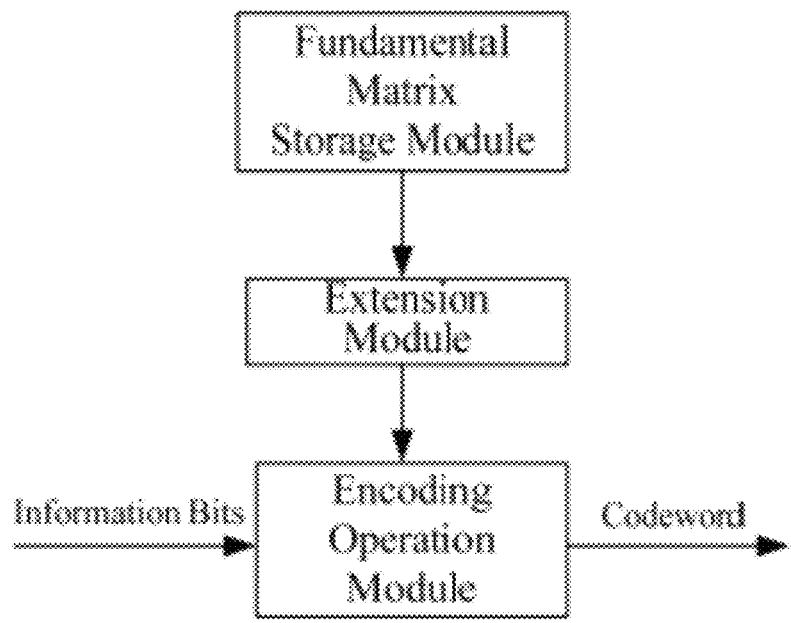
FIG. 18 is a structure diagram of the encoder in the embodiments of the invention.

As shown in FIG. 18, an encoder of LDPC code is provided first, including a storage module for storing the base matrixes corresponding to all code sizes, an extension module and an encoding operation module, wherein:

The extension module is used for extending the base matrix of current code size according to the extension factor and basic permutation matrix to get the (M×z)×(N×z) parity check matrix of LDPC code. The basic permutation matrix is usually an identity matrix. During extension, 0 matrix is used to replace the "−1" in the base matrix, and a z×z identity matrix after a night cyclic shift of j bits is used to replace other non-negative coefficient j.

The encoding operation module is used for accomplishing encoding calculation for getting the N-bits codeword from N-M bits source data based on the parity check matrix of LDPC code after extension.

It needs to be pointed out that the encoding can be completed with the base matrix directly without using the extension module. The base matrix and parity check matrix are essentially same, the base matrix being only a compressed form of the parity check matrix. Therefore, the encoding of LDPC code is implemented through the parity check matrix theoretically, whereas the encoding can be implemented through the base matrix directly in terms of form, for example, the operation that a matrix obtained by shifting a z×z identity matrix circularly right for once multiplies a z×1 column vector equates to shifting the vector circularly left for once (the element in the base matrix is the number of the shift). Therefore, the operation of a parity check matrix can always equivalently find corresponding vector operation of the base matrix, thus the encoding process based on the parity check matrix can be implemented through the base matrix directly, while the theory, method and flow are the same.

Therefore, in terms of realization, the encoding/decoding can be implemented by using the base matrix, without needing the step of extension or extension module. However, the method for implementing the encoding by using the base matrix is deduced from the encoding/decoding method of parity check matrix, so the encoding/decoding theory of parity check matrix is used in essence.

The encoding operation may adopt the direct method or Richarson method or any other method. LDPC code is a type of special linear block code. In communication, when a codeword whose packet length is N bits is sent, in order to keep a certain ability of correcting errors, M parity bits are needed, and each codeword should satisfy $Hx^T=0^T$ in which, H is a parity check matrix with the dimension of m×n in binary filed. All the operations are carried out in binary field GF(2), in which, addition and subtraction are "NOR" operation, and multiplication is "AND" operation.

When H is of full order, there will be $2^{N-M}$ codewords. A codeword stands for a source block whose length is N-M in the invention. The encoding is to determine a mapping from N-M bits source date to N bits codeword.

In the following, a direct encoding method of the current system block code will be presented: the M×N parity check matrix H is divided into two blocks of M×(N−M) and M×M, i.e. H=[A|B]. In the invention, the greatest liner irrelative set of the column vector of H matrix (M column vectors) needs to be found out, which is to be placed in the position of B by rearranging the columns, in which, B is non-singular matrix, i.e. it is invertible. By the same manner, a codeword x is divided into two parts, i.e. N−M information bits s and M parity bits c. Based on H×x=0, it can be concluded that:

$$[A \mid B] \times \begin{bmatrix} s \\ c \end{bmatrix} = 0$$

further, it is concluded that A×s+B×c=0, so that $c=B^{-1}As$.

Corresponding to the division of the codeword, the check matrix is also divided into two parts, i.e. A and B, corresponding to system bit and check bit respectively. When B adopts special matrix structure, such as the strict lower triangle structure (semi-random matrix), double lower triangle structure etc., $B^{-1}$ has very simple form, the parity-bit part c of the codeword can be obtained directly according to the formula above, and the encoder can be ensured to have linear complexity.

In the following, a Richarson linear time encoding method is presented: when the parity check matrix H has quasi-low triangle structure, Richarson advanced a method for implementing linear time encoding as shown in the figure. Assuming that H has the following form:

$$H = \begin{pmatrix} A & B & T \\ C & D & E \end{pmatrix}$$

Here, the dimension of A is (m−g)×(n−m), the dimension of B is (m−g)×g, the dimension of T is (m−g)×(m−g), the dimension of C is g×(n−m), the dimension of D is g×g, the dimension of E is g×(m−g). All these matrixes are sparse matrixes, while T is lower triangle matrix and all elements of the main diagonal are 1. The codeword after encoding is set to be x=(s, $p_1$, $p_2$), in which s refers to the system-bit part of the encoding codeword, $p_1$ and $p_2$ refer to the parity-bit part of the codeword, the length of $p_1$ is g and the length of $p_2$ is (m−g), which can be obtained by the following formulas:

$$p_1^T = \phi^{-1}(-ET^{-1}A+C)s^T$$

$$p_2^T = -T^{-1}(As^T+Bp_1^T)$$

According to the method above, the function of the encoder of LDPC code designed in the invention is to implement the multiplication and addition operations of the sparse matrix. For the LDPC code based on the identity matrix and its cyclic shift matrix, the multiplication operation of the sparse matrix can be implemented through a plurality of z-bits cyclic shift registers and a plurality of z-bits adders, while the addition operation of the sparse matrix is completed by the above plurality of z-bits adders. Once the base matrix and extension factor are determined, according to the direct method above or Richarson method, it is easy to use a plurality of z-bits cyclic shift registers and a plurality of z-bits adders to construct the hardware circuit of a LDPC encoder. In short, the encoder of LDPC code designed by the invention can be determined uniquely by its parity check matrix.

Figure 19:
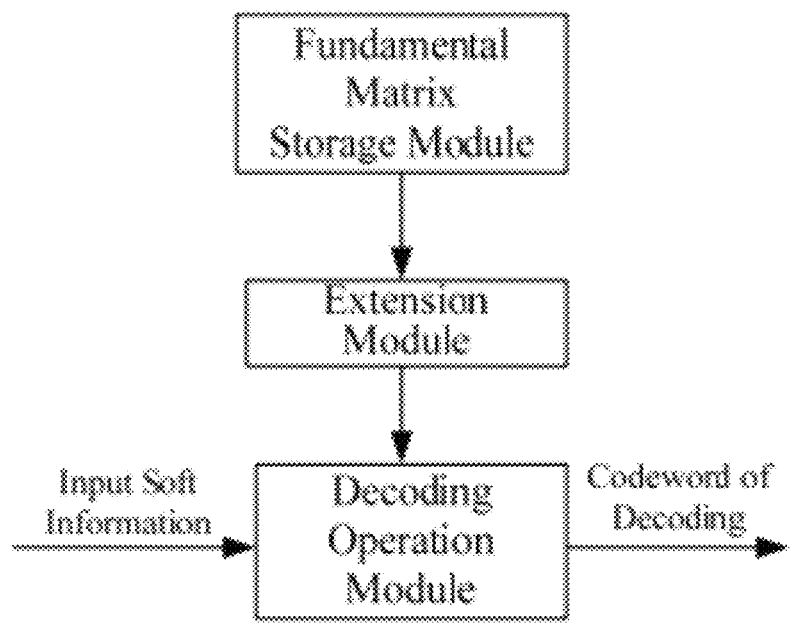
FIG. 19 is a structure diagram of the decoder in the embodiments of the invention.

Next, a decoder of LDPC code will be presented. As shown in FIG. 19, the decoder also includes a storage module for depositing the base matrix corresponding to each code size and an extension module (the extension module is also optional in the decoder based on the same reason as that of the extension module of the encoder), and a decoding operation module for correcting the input codeword bits having been interfered and output them based on the parity check matrix of LDPC code obtained through extension. Specifically, the message passing algorithm can be used as the decoding algorithm, which, however, does not mean limitation to this invention.

Message passing algorithm is a kind of decoding technique for transmitting information between nodes in bipartite graph. The nodes can work as independent processors, and are able to gather input information and generate output information. The content about the time and information is not controlled uniformly; on the contrary, bit and check node follow a general local rule, i.e. once all of the input information is received, an output is generated. When there is not a cycle in the graph, the message passing algorithm may converge to a Posteriori Log-likelihood Ratio after transmitting the information for finite times. However, most part of the good codes possess cycles in their bi-partite graphs. When the codes having cycles are used, the message passing algorithm will not be exact but just similar. Fortunately, even if there are cycles in the graph, the message passing algorithm still works very well and has low complexity.

In the following, a regular or irregular message passing algorithm on logarithm field is presented. The subscript sets $M_n=\{m:H_{m,n}=1\}$ and $N_m=\{n:H_{m,n}=1\}$ are defined. The information transmitted from check node m to variable node n of $u_{m,n}^{(l)}$ in the first iteration is defined. $\lambda_n^{(l)}$ is the Log-likelihood Ratio forecast value of bit n after iteration for one time.

The algorithm is as follows:
Initialization: • for any $m \in \{1, \ldots, M\}$ and $n \in N_m$, there will be $u_{m,n}^{(0)}=0$
for any $n \in \{1, \ldots, N\}$, there will be $\lambda_n^{(0)}=(2/\sigma^2)r_n$
Iteration: for the times of iterations $l=1, 2, \ldots, l_{max}$
updating check node
for $m \in \{1 \ldots M\}$ and $n \in N_m$,
there will be $$u_{m,n}^{(l)} = -2\tanh^{-1}\left(\prod_{i \in N_m - n}\tanh\left(\frac{-\lambda_i^{(l-1)} + u_{m,i}^{(l-1)}}{2}\right)\right)$$

updating variable node
for $n \in \{1 \ldots N\}$,
there will be $$\lambda_n^{(l)} = (2/\sigma^2)r_n + \sum_{m \in M_n} u_{m,n}^{(l)}$$

The above algorithm can be explained by the message passing process in the bi-partite graph.

For the LDPC code decoder of hardware design, firstly, a two-dimension storage net is needed for storing extrinsic information of each edge of the bi-partite graph, and ensuring the validity of the message passing path; then, M independent Check Node Processing Units (CNPU) corresponding to M check nodes are needed for calculating all of the check nodes and transmitting information between neighboring nodes; N independent Variable Node Processing Units (VNPU) calculating N variable nodes are also needed for calculating the sum in all the check nodes and transmitting information between neighboring nodes. The parallel implementation of the hardware ensures the high speed iteration decoding of LDPC code. In short, once the parity check matrix of LDPC code is determined, the decoder of one LDPC code can be designed. When using hardware implementation (such as Field Programmable Gate Array (FPGA)), the parallel degree of the decoder can be very high and the structure is simple.

To sum up, the encoder and decoder of one LDPC code can be determined uniquely by the parity check matrix. In fact, the parity check matrix of LDPC code determines not only the performance of the LDPC code decoder but also the complexity, storage space and processing delay of the encoder and decoder of LDPC code. Therefore, it is important to look for a suitable parity check matrix structure of LDPC code. The method of the invention designs the good encoder and decoder of LDPC code from the point of view of the girth of LDPC code. Under the condition of given code sizes, parity check matrix with the girth as large as possible and the number of the shortest cycles as few as possible under the same girth can be found.

If the base matrix can not be ensured to be unique for each different extension factor, for each different code size (or extension factor), said LDPC code encoder/decoder needs to store a base matrix. When there are many code sizes, many base matrixes need to be stored, raising high demand for the storage space of the LDPC code encoder/decoder.

Concerning the above problems, the invention advances another embodiment, which provides base matrix used for different code sizes and being able to satisfy the requirements on the girth under different code sizes. In this embodiment, the code size of the LDPC code is variable. The parity check matrix corresponding to different code sizes is obtained by extending the unique and fixed $M_b \times N_b$ base matrix and the variable extension factor z. It is ensured that the extension code with any code size in the design range is with large girth (i.e. the length of the shortest cycle is as large as possible), and the short cycles of said LDPC code are eliminated to the largest extent.

It is assumed that z is any extension factor appearing in set $[z_{min}, \ldots, z_{max}]$, wherein $z_{min}$ is the extension factor of the designed LDPC code with the shortest code size, $z_{max}$ is the extension factor of the designed LDPC code with the longest code size, $[z_{min}, \ldots, z_{max}]$ is the set constituted by the extension factors corresponding to the designed LDPC code of all the code sizes, all the code sizes are $N_b \times [z_{min}, \ldots, z_{max}]$. Under different girths, said parity check matrixes have different structures, the relationship is as follows:

The sufficient and necessary conditions under which the girths of the parity check matrixes of all code sizes are 6 are: in the base matrix being based upon $\forall z \in [z_{min}, L, z_{max}]$, after the elements are corrected according to the code sizes, for random elements i, j, k, l which construct in anticlockwise the short cycle with length 4, there is always $\mod(i-j+k-l, z) \neq 0$; for random elements i, j, k, l, m, n which construct in anticlockwise the short cycle with length 6, there is always $\mod(i-j+k-l+m-n+s-t, z) \neq 0$;

The sufficient and necessary conditions under which the girths of the parity check matrixes of all code sizes are 8 are: in the base matrix being based on, for $\forall z \in [z_{min}, L, z_{max}]$, after the elements are corrected according to the code sizes, for random elements i, j, k, l which construct in anticlockwise the short cycle with length 4, there is always $\mod(i-j+k-l, z) \neq 0$; for random elements i, j, k, l, m, n which construct in anticlockwise the short cycle with length 6, there is always $\mod(i-j+k-l+m-n+s-t, z) \neq 0$;

The sufficient and necessary conditions under which the girths of the parity check matrixes of all code sizes are 8 are: in the base matrix being based on, for $\forall z \in [z_{min}, L, z_{max}]$, after the elements are corrected according to the code sizes, for random elements i, j, k, l which construct in anticlockwise the short cycle with length 4, there is always $\mod(i-j+k-l, z) \neq 0$; for random elements i, j, k, l, m, n which construct in anticlockwise the short cycle with length 6, there is always $\mod(i-j+k-l+m-n+s-t, z) \neq 0$; and for random elements i, j, k, l, m, n, s, t which construct in anticlockwise the short cycle with length 8, there is always $\mod(i-j+k-l+m-n+s-t, z) \neq 0$.

The invention also provides a specific embodiment for constructing a base matrix satisfying the relationship above, in which, the first three steps of the method of constructing the LDPC code parity check matrix with large girth are the same, while the forth step for choosing and filling value for a certain position after the original base matrix with the girth as large as possible and the number of the shortest cycles as few as possible is constructed, is implemented according to following steps of:

(21) taking part of the base matrix Hc having been constructed as an object, going through all possible paths by starting from the edge corresponding to the element to be filled in bi-partite graph, and finding all of the short cycles;

(22) when choosing value for the element, first choosing a value satisfying the base matrix girth≧10, if such a value can not be found, choosing a value satisfying the base matrix girth≧8, if such a value can still not be found, choosing a value satisfying the base matrix girth≧6; the specific method for choosing the values is as follows:

when the base matrix girth≧10, the values of the element and other elements which jointly construct said short cycles should satisfy: for random elements i, j, k, l which construct in anticlockwise the short cycle with length 4 among said short cycles, there is always mod(i−j+k−l, z/2)≠0; for random elements i, j, k, l, m, n which construct in anticlockwise the short cycle with length 6 among said short cycles, there is always mod(i−j+k−l+m−n, z)≠0; and for random elements i, j, k, l, m, n, s, t which construct in anticlockwise the short cycle with length 8 among said short cycles, there is always mod(i−j+k−l+m−n+s−t, z)≠0;

when the base matrix girth≧8, the values of the element and other elements which jointly construct said short cycles should satisfy: for random elements i, j, k, l which construct in anticlockwise the short cycle with length 4 among said short cycles, there is always mod(i−j+k−l, z)≠0; for random elements i, j, k, l, m, n which construct in anticlockwise the short cycle with length 6 among said short cycles, there is always mod(i−j+k−l+m−n, z)≠0;

when the base matrix girth≧6, the values of the element and other elements which jointly construct said short cycles should satisfy: for random elements i, j, k, l which construct in anticlockwise the short cycle with length 4 among said short cycles, there is always mod(i−j+k−l, z)≠0;

The method is same as that of prior step 12, only with difference of stating manners

(23) after a suitable value has been chosen, correcting the base matrix to be the base matrix corresponding to all the other code sizes, judging whether the values of the element and other elements which jointly construct said short cycle in each base matrix obtained through correction satisfy the requirements of the base matrix girth≧8 or the girth≧6 (if the value satisfying girth≧8 can not be found, choosing the value satisfying the girth≧6), if yes, choosing the next position; otherwise, returning to step (22) to re-choose the value;

on girth, if not, re-choosing the values. Said correction algorithm may adopt the ways of mod, scale+floor or scale+round. It is assumed that $P_{i,j}$ is the non-negative element of row i and column j in the base matrix, $P'_{i,j}$ is the element after correction.

For the way of mod, there is $$P'_{ij} \equiv P_{ij} \bmod \frac{n}{N}$$

For the way of scale+floor:

$$P'_{ij} = \left\lfloor P_{ij} \times \frac{n}{2304} \right\rfloor$$

For the way of scale+round:

$$P'_{ij} = \text{Round}\left(P_{ij} \times \frac{n}{2304}\right)$$

in which, N is the column number of the base matrix, n is the codeword length of the LDPC code of the parity check matrix to be generated. Mod is the operation of mod, ⌊⌋ is the operation of floor low and round is the operation of round.

The steps of extending the base matrix based on the known extension factor z are the same, only with difference of the extension factor.

In the following, an example of the embodiment is presented, in which, its base matrix is unique, and a LDPC code whose code rate is ⅔ and whose codeword length varies continuously from 576 to 2304 with an interval of 96 is required to be designed. According to the method of the invention, a 8×24 original base matrix is designed, which is a semi-regular check matrix, the check matrix part corresponding to the information bits has regular structure with both the row weight and column weight being 4; the check matrix part corresponding to the parity-bit has double lower triangle structure to implement the direct linear time encoding.

Based on the above matrix structures and method, the unique base matrix BaseMatrixH4 is obtained. When the codeword length varies from 576 to 2034, its girth is always 6.

$$\text{BaseMatrixH4} = \begin{bmatrix} 90 & 55 & -1 & -1 & 15 & -1 & 13 & 42 & -1 & -1 & 51 & -1 & 48 & 18 & -1 & -1 & 0 & 0 & -1 & -1 & -1 & -1 & -1 & -1 \\ -1 & 4 & 66 & 74 & -1 & -1 & -1 & 25 & 63 & 88 & -1 & -1 & 23 & -1 & 64 & -1 & -1 & 0 & 0 & -1 & -1 & -1 & -1 & -1 \\ 70 & -1 & -1 & 79 & 60 & -1 & 42 & -1 & 6 & -1 & -1 & 5 & -1 & 29 & -1 & 92 & -1 & -1 & 0 & 0 & -1 & -1 & -1 & -1 \\ 28 & 72 & 75 & -1 & -1 & 92 & -1 & -1 & 15 & -1 & 91 & 2 & 81 & -1 & -1 & -1 & -1 & -1 & -1 & 0 & 0 & -1 & -1 & -1 \\ -1 & -1 & -1 & 67 & 70 & 69 & -1 & 87 & -1 & 84 & -1 & 6 & 90 & -1 & -1 & 43 & 0 & -1 & -1 & -1 & 0 & 0 & -1 & -1 \\ 10 & -1 & 41 & -1 & -1 & 47 & 27 & 65 & -1 & -1 & -1 & 67 & -1 & -1 & 14 & 30 & -1 & -1 & -1 & -1 & -1 & 0 & 0 & -1 \\ -1 & 15 & -1 & 47 & -1 & 44 & 40 & -1 & -1 & 22 & 72 & -1 & -1 & 92 & 18 & -1 & -1 & -1 & -1 & -1 & -1 & -1 & 0 & 0 \\ -1 & -1 & 44 & -1 & 93 & -1 & -1 & -1 & 35 & 9 & 54 & -1 & -1 & 84 & 47 & 62 & 0 & -1 & -1 & -1 & -1 & -1 & -1 & 0 \end{bmatrix}$$

(24) repeating the above steps (21)~(23), obtaining the base matrix satisfying the requirements of the girth under all code sizes till the choosing of values for all the non-zero elements being finished.

Figure 17:
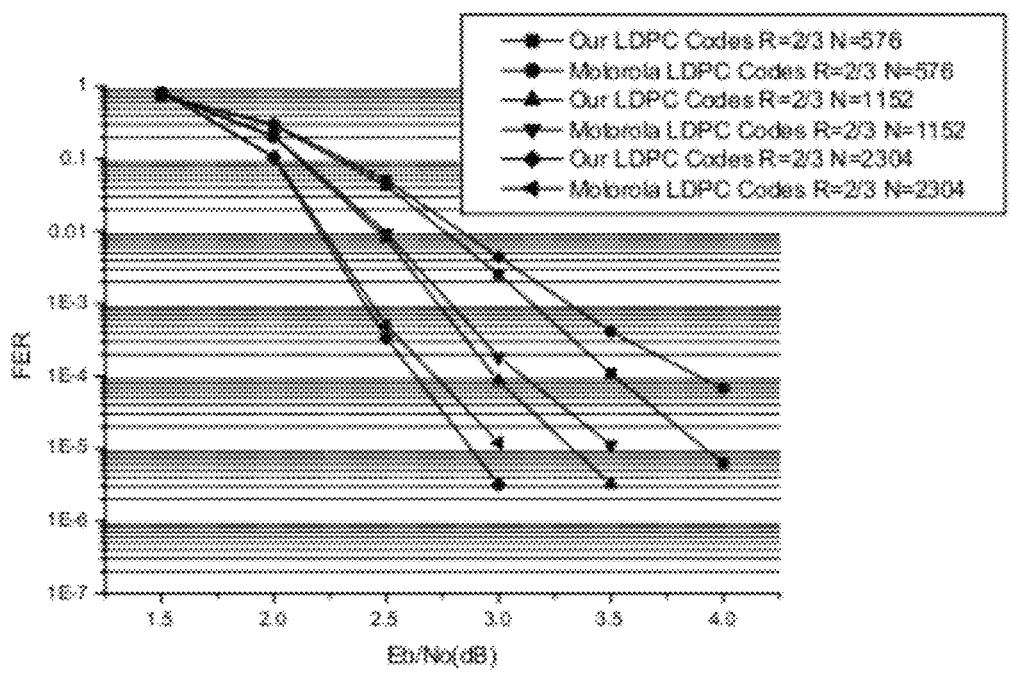
FIG. 17 is a comparison diagram between FER of the R=⅔ LDPC code with girth=6 constructed in embodiment 2 of the invention and the FER of the R=⅔ LDPC code with girth=4 constructed by 802.16e contribution.

The steps (21), (22) and (24) above are same with the steps (11), (12) and (13) for constructing check matrix with large girth stated in the above text, but in this embodiment, step (23) is added for correcting the prime base matrix, judging whether the corrected base matrix satisfies the requirements FIG. 17 is the comparison drawing between the FER of the LDPC code with R=⅔ and girth=6 constructed by the embodiment two of the invention and the FER of the LDPC code with R=⅔ and girth=4 constructed by 16e construction.

As shown in FIG. 17, under the same code rate (⅔), same codeword length (576,1152 and 2304 respectively), same degree distribution and same check matrix part corresponding to the parity check matrix, the simulation demonstrates that the performance of the LDPC code with girth=6 obtained by extending BaseMatrixH4 is obviously better than that of the LDPC code with girth=4 obtained by extending the base matrix given by the 802.16e contribution (Motorola IEEEC802.16e-04/373r1 "LDPC coding OFDMA PHY"). The LDPC code constructed in the invention eliminates the error floor of LDPC code.

Actually, under other code sizes, the LDPC code with larger girth designed in the invention is better than prior art. The invention can not only be used in regular code but also in irregular code. The invention does not depend on specific degree distribution, and can be used in LDPC code of any form based on the identity matrix and its cycle shift matrix. The invention has universal applicability, and can eliminate the error floor of the LDPC code.

In this embodiment, the LDPC code with particular code rate, particular girth (such as 6, 8, 10), and variable code size is presented. It is able to keep the base matrix unique and fixed with the varying code size. Compared with the traditional methods, this invention solves the problem of eliminating the short cycles of the LDPC code with specific code rate and continuously varying code size without increasing the storage capacity of the encoder/decoder and the complexity of calculation. In fact, if the maximum element in the base matrix is large enough, the choosing range of the values of the base matrix will be large enough. If the designed girth demanded is not very high, a unique base matrix can be found to make z, no matter what values it takes, satisfy the inequation of the specific girth above.

In the invention, another embodiment is presented which provides an encoder and a decoder based on LDPC code, wherein, the parity check matrix used by the encoder and decoder under different code sizes is obtained by extending the unique base matrix. The encoder of the invention includes a storage module which stores the unique base matrix, a correction module, an extension module and an encoding operation module, wherein:

the correction module is for reading the base matrix from the storage module and correcting the non-minus values in the matrix according to the code size of the current data stream; during correction, the correction module used for constructing the base matrix is used;

the extension module is for extending the corrected base matrix according to the extension factor and basic permutation matrix so as to get the (M×z)×(N×z) parity check matrix of the LDPC code;

the encoding operation module is for completing the encoding operation of getting N-bits codeword from N-M bits source data based on the parity check matrix of the LDPC code obtained through extension; it may also adopt the above direct method, or Richarson method or any other methods.

The decoder of this embodiment includes a decoding operation module, a storage module of the base matrix, a correction module and an extension module, in which the storage module, the correction module and the extension module are same with those of the encoder. The decoding operation module is used for correcting the input codeword bit having been interfered and then outputting the same based on the parity check matrix of LDPC code obtained through extension. It may also adopt the message passing algorithm as the decoding algorithm, which, however, does not mean any limitation to this invention.

Currently, people have ever higher demand for encoding ability of error correcting in digital communications systems, such as communication, radar, remote control and detection, to ensure the reliability of data transmission. However, the existing digital communication systems usually have no ability of automatic error correcting, have low ability of correcting error coding, so that the reliability of data transmission can not be ensured effectively, and tasks of high speed and strong bursty can not be accomplished.

Based on the problem above, the invention advances another embodiment which provides a digital communication system including an encoder and decoder of LDPC code based on identity matrix and its cyclic shift matrix, in which, the encoder and decoder are determined uniquely by a parity check matrix of LDPC code. Said parity check matrix can be obtained through two manners, one is extending the different base matrixes under different code sizes, the other is extending the unique base matrix under different code sizes. The base matrixes under the above two cases can be obtained from the method discussed above to make the parity check matrix obtained through extension possesses large girth. It will not be discussed further here.

In conclusion, the invention advances the encoder and decoder of LDPC code based on identity matrix and its cyclic shift matrix which can overcome the error floor. The encoder and decoder of LDPC code are based on parity check matrix, providing the universal structure of the parity check matrix with large girth to promote the performance of the decoder. The invention advances the method of changing the base matrix based on the code size so as to ensure the parity check matrix designed possesses the girth as large as possible for the first time, and also the system algorithm of LDPC code based on the identity matrix and its cyclic shift matrix. In this invention, the parity check matrix with larger girth is constructed while ensuring relatively large code size, so that the performance of LDPC code is improved, the descending speed of BER curve is accelerated and the error floor of LDPC code is eliminated effectively, thus the LDPC code reaches its optimal performance, reducing the complexity of the encoder and decoder as well as the storage space, improving the encoding and decoding performance, and realizing a relatively high error correcting technique.

Apparently, this invention can also have many other embodiments. The present invention is, therefore, not limited to the particular embodiments described and/or exemplified, but is capable of considerable variation and modification without departure from the scope of the appended claims, which should be covered within the protection scope of the appended claims of this invention,

INDUSTRIAL APPLICABILITY

The invention can be applied to the error correction coding technique of data transmission in digital communication system, providing a type of LDPC code having ideal performance under high signal-to-noise ratio (SNR).

What we claim is:

1. A method for generating an encoder/decoder based on Low Density Parity Check (LDPC) code, the encoder/decoder being determined uniquely by a parity check matrix of a LDPC code, wherein said method comprises:

storing a base matrix of the parity check matrix; and based on the base matrix of the parity check matrix, performing an encoding operation by the encoder for obtaining a codeword from source data or performing a decoding operation by the decoder by correcting input codeword bits that have been interfered and then outputting the corrected input codeword bits;

wherein the base matrix is unique to the LDPC code with a fixed code rate and variable code sizes;

said method further comprises steps of reading the stored base matrix, modifying non-minus elements in the base matrix according to the code size of a current data flow; to make the matrix meets at least one of the following conditions:

when $\forall z \in [z_{min}, L, z_{max}]$, after the elements are modified according to the code size, for random elements i, j, k, l which construct in anticlockwise a short cycle with length 4, there is always $\mod(i-j+k-l, z) \neq 0$;

when $\forall z \in [z_{min}, L, z_{max}]$, after the elements are modified according to the code size, for random elements i, j, k, l which construct in anticlockwise a short cycle with length 4, there is always $\mod(i-j+k-l, z) \neq 0$; and for random elements i, j, k, l, m, n which construct in anticlockwise a short cycle with length 6, there is always $\mod(i-j+k-l+m-n, z) \neq 0$; or when $\forall z \in [z_{min}, L, z_{max}]$, after the elements are modified according to the code size, for random elements i, j, k, l which construct in anticlockwise a short cycle with length 4, there is always $\mod(i-j+k-l, z/2) \neq 0$; for random elements i, j, k, l, m, n which construct in anticlockwise a short cycle with length 6, there is always $\mod(i-j+k-l+m-n, z) \neq 0$; and for random elements i, j, k, l, m, n, s, t which construct in anticlockwise a short cycle with length 8, there is always $\mod(i-j+k-l+m-n+s-t, z) \neq 0$;

wherein z, in all of the above conditions, refers to any extension factor appearing in a set $[z_{min}, \ldots, z_{max}]$, $z_{min}$ is the extension factor of the LDPC code with the shortest code size, $z_{max}$ is the extension factor of the LDPC code with the longest code size.

2. The method for generating the encoder/decoder of claim 1, wherein said base matrix of the parity check matrix is constructed by the following steps of:

Step 1, determining a code rate, a code size, and a number of parity bits of the base matrix of LDPC code to be constructed;

Step 2, determining a row weight vector and a column weight vector of said base matrix;

Step 3, based on said row weight vector and column weight vector, constructing an original base matrix with girth as large as possible and a number of shortest cycles under a same girth as small as possible, wherein the girth is a length of the shortest cycle;

Step 4, based on said original base matrix constructed, choosing values from a set $\{0, 1, 2, \ldots, z-1\}$ and placing the values on all of "1" positions in the matrix one by one, and constructing the base matrix with the girth as large as possible, wherein z is an extension factor.

3. The method for generating the encoder/decoder of claim 2, wherein in said step 3, a Bit-Filling algorithm is used for constructing the original base matrix with girth as large as possible and number of the shortest cycles as few as possible.

4. The method for generating the encoder/decoder of claim 2, wherein in said step 4, the part for the base matrix corresponding to parity bits utilizes a quasi-lower triangular structure when constructing the base matrix.

5. The method for generating the encoder/decoder of claim 2, wherein said parity check matrix under different code sizes is obtained by extending the unique base matrix; when choosing values in step 4, the base matrix under all of the code sizes or the base matrix after correction are required to satisfy the requirements of large girth; and the unique base matrix is corrected according to the actual code size, and is extended to be the required parity check matrix according to the corresponding extension factor.

6. The method for generating the encoder/decoder of claim 5, wherein a requirement for said base matrix girth is girth$\geq 8$ or girth$\geq 6$.

7. The method for generating the encoder/decoder of claim 2, wherein constructing the base matrix comprises the following steps of:

(a) with part of the base matrix finished construction being the object, going through all possible paths by starting from an edge corresponding to an element to be filled in bi-partite graph, so as to find all of the short cycles;

(b) when choosing a value for the element, first choosing a value satisfying the base matrix girth$\geq 10$, if such a value can not be found, choosing a value satisfying the base matrix girth$\geq 8$, if still can not be found, choosing a value satisfying the base matrix girth$\geq 6$;

when the base matrix girth$\geq 10$, the values of the element and other elements which jointly construct said short cycles should satisfy: for random elements i, j, k, l which construct in anticlockwise a short cycle with length 4 among said short cycles, there is always $\mod(i-j+k-l, z/2) \neq 0$; for random elements i, j, k, l, m, n which construct in anticlockwise a short cycle with length 6 among said short cycles, there is always $\mod(i-j+k-l+m-n, z) \neq 0$; and for random elements i, j, k, l, m, n, s, t which construct in anticlockwise a short cycle with length 8 among said short cycles, there is always $\mod(i-j+k-l+m-n+s-t, z) \neq 0$;

when the base matrix girth$\geq 8$, the values of the element and other elements which jointly construct said short cycles should satisfy: for random elements i, j, k, l which construct in anticlockwise a short cycle with length 4 among said short cycles, there is always $\mod(i-j+k-l, z/2) \neq 0$; for random elements i, j, k, l, m, n which construct in anticlockwise a short cycle with length 6 among said short cycles, there is always $\mod(i-j+k-l+m-n, z) \neq 0$;

when the base matrix girth$\geq 6$, the values of the element and other elements which jointly construct said short cycles should satisfy: for random elements i, j, k, l which construct in anticlockwise a short cycle with length 4 among said short cycles, there is always $\mod(i-j+k-l, z) \neq 0$;

(c) repeating the above steps (a) and (b) until the choosing of values for all non-zero elements is completed, wherein the base matrix with a girth as large as possible can be obtained.

8. The method for generating the encoder/decoder of claim 7, wherein said parity check matrix under different code sizes is obtained by extending the unique base matrix; in said step (b), the value is chosen from a set $\{0, 1, 2, \ldots, z_{max}-1\}$, $z_{max}$ is the extension factor of the LDPC code with the largest code size, and a step (b1) is further included between steps (b) and (c): after an appropriate value is chosen, correcting the base matrix to be the ones that correspond to all of the other code sizes, judging whether the values of the element and other elements which jointly construct said short cycles in each of the base matrixes obtained through correction satisfy requirements on the girth of the base matrix, if yes, choosing the next position, otherwise, returning to step (b) to re-choose the values; and after the unique base matrix is corrected according to actual code size, it is extended to be the required parity check matrix according to the corresponding extension factor.

9. The method for generating the encoder/decoder of claim 8, wherein
said correction on the base matrix is calculated based on column number of the base matrix and the codeword length of the LDPC code which is to generate the parity check matrix, and by ways of mod, scale+floor, or scale+round.

10. The method for generating the encoder/decoder of claim 8, wherein a requirement for said base matrix girth is girth≧8 or girth≧6.

11. The method for generating the encoder/decoder of claim 1, wherein
an identity matrix and its cyclic shift matrix are employed as a basic permutation matrix, for extending said base matrix to be the parity check matrix.

12. An encoder based on Low Density Parity Check (LDPC) code, including a storage module and an encoding operation module, wherein:
said storage module is for storing a base matrix of a parity check matrix; and
said encoding operation module is for performing an encoding operation for obtaining a codeword from source data based on the base matrix of the parity check matrix,
wherein the base matrix is unique to the LDPC code with a fixed code rate and variable code sizes; said encoder also includes a correction module used for reading the base matrix from the storage module, modifying non-minus elements in the base matrix according to the code size of a current data flow and transmitting them to following modules for processing; during correction, the correction module used for constructing the base matrix is used to make the matrix meet at least one of the following conditions:
when $\forall z \in [z_{min}, L, z_{max}]$, after the elements are modified according to the code size, for random elements i, j, k, l which construct in anticlockwise a short cycle with length 4, there is always mod(i−j+k−l, z)≠0;
when $\forall z \in [z_{min}, L, z_{max}]$, after the elements are modified according to the code size, for random elements i, j, k, l which construct in anticlockwise a short cycle with length 4, there is always mod(i−j+k−l, z)≠0; and for random elements i, j, k, l, m, n which construct in anticlockwise a short cycle with length 6, there is always mod(i−j+k−l+m−n, z)≠0; or
when $\forall z \in [z_{min}, L, z_{max}]$, after the elements are modified according to the code size, for random elements i, j, k, l which construct in anticlockwise a short cycle with length 4, there is always mod(i−j+k−l, z/2)≠0; for random elements i, j, k, l, m, n which construct in anticlockwise a short cycle with length 6, there is always mod(i−j+k−l+m−n, z)≠0; and for random elements i, j, k, l, m, n, s, t which construct in anticlockwise a short cycle with length 8, there is always mod(i−j+k−l+m−n+s−t, z)≠0,
wherein z, in all of the above conditions, refers to any extension factor appearing in a set $[z_{min}, \ldots z_{max}]$, $z_{min}$ is the extension factor of the LDPC code with the shortest code size, $z_{max}$ is the extension factor of the LDPC code with the longest code size.

13. The encoder of claim 12, including an extension module used for extending the base matrix with the current code size according to the extension factor and the basic permutation matrix to get the parity check matrix of the LDPC code, wherein, the parity check matrix extended is exactly the one based on which, the encoding operation module accomplishes the encoding operation.

14. A decoder based on Low Density Parity Check (LDPC) code, including a storage module and a decoding operation module, wherein:
said storage module is for storing a base matrix of a parity check matrix; and
said decoding operation module is for correcting input codeword bits which have been interfered and then outputting the corrected input codeword bits based on the base matrix of the parity check matrix,
wherein the base matrix is unique to the LDPC code with a fixed code rate and variable code sizes; said encoder also includes a correction module used for reading the base matrix from the storage module, modifying non-minus elements in the base matrix according to the code size of a current data flow to make the matrix meet at least one of the following conditions:
when $\forall z \in [z_{min}, L, z_{max}]$, after the elements are modified according to the code size, for random elements i, j, k, l which construct in anticlockwise a short cycle with length 4, there is always mod(i−j+k−l, z)≠0;
when $\forall z \in [z_{min}, L, z_{max}]$, after the elements are modified according to the code size, for random elements i, j, k, l which construct in anticlockwise a short cycle with length 4, there is always mod(i−j+k−l, z)≠0; and for random elements i, j, k, l, m, n which construct in anticlockwise a short cycle with length 6, there is always mod(i−j+k−l+m−n, z)≠0; or
when $\forall z \in [z_{min}, L, z_{max}]$, after the elements are modified according to the code size, for random elements i, j, k, l which construct in anticlockwise a short cycle with length 4, there is always mod(i−j+k−l, z/2)≠0; for random elements i, j, k, l, m, n which construct in anticlockwise a short cycle with length 6, there is always mod(i−j+k−l+m−n, z)≠0; and for random elements i, j, k, l, m, n, s, t which construct in anticlockwise a short cycle with length 8, there is always mod(i−j+k−l+m−n+s−t, z)≠0,
wherein z, in all of the above conditions, refers to any extension factor appearing in a set $[z_{min}, \ldots, z_{max}]$, $z_{min}$ is the extension factor of the LDPC code with the shortest code size, $z_{max}$ is the extension factor of the LDPC code with the longest code size.

15. The decoder of claim 14, characterized in further including an extension module, which is for extending the base matrix of current code size according to extension factor and basic permutation matrix to get the parity check matrix of the LDPC code, wherein the above parity check matrix obtained through extension is the one based on which, said decoding operation module accomplishes the decoding operation.

* * * * *